(12) United States Patent
Nam et al.

(10) Patent No.: US 9,953,999 B2
(45) Date of Patent: Apr. 24, 2018

(54) MEMORY DEVICE

(71) Applicants: Phil Ouk Nam, Suwon-si (KR); Sung Gil Kim, Yongin-si (KR); Seulye Kim, Seoul (KR); Hong Suk Kim, Yongin-si (KR); Jae Young Ahn, Seongnam-si (KR); Ji Hoon Choi, Seongnam-si (KR)

(72) Inventors: Phil Ouk Nam, Suwon-si (KR); Sung Gil Kim, Yongin-si (KR); Seulye Kim, Seoul (KR); Hong Suk Kim, Yongin-si (KR); Jae Young Ahn, Seongnam-si (KR); Ji Hoon Choi, Seongnam-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 15/375,944

(22) Filed: Dec. 12, 2016

(65) Prior Publication Data
US 2018/0026046 A1  Jan. 25, 2018

(30) Foreign Application Priority Data

Jul. 19, 2016 (KR) .................. 10-2016-0091328

(51) Int. Cl.
| | |
|---|---|
| *H01L 29/76* | (2006.01) |
| *H01L 27/11582* | (2017.01) |
| *H01L 27/11519* | (2017.01) |
| *H01L 27/11556* | (2017.01) |
| *H01L 27/11565* | (2017.01) |
| *H01L 29/423* | (2006.01) |

(52) U.S. Cl.
CPC .. *H01L 27/11582* (2013.01); *H01L 27/11519* (2013.01); *H01L 27/11556* (2013.01); *H01L 27/11565* (2013.01); *H01L 29/4234* (2013.01); *H01L 29/42324* (2013.01)

(58) Field of Classification Search
None
See application file for complete search history.

(56) References Cited

U.S. PATENT DOCUMENTS

| | | | |
|---|---|---|---|
| 9,006,884 B2 | 4/2015 | Lee et al. | |
| 9,018,696 B2 | 4/2015 | Wada et al. | |
| 9,184,177 B2 | 11/2015 | Imamura et al. | |
| 9,299,716 B2 | 3/2016 | Hwang et al. | |
| 2012/0070944 A1 | 3/2012 | Kim et al. | |
| 2014/0191389 A1* | 7/2014 | Lee | H01L 21/7685 257/734 |
| 2015/0179564 A1 | 6/2015 | Lee et al. | |
| 2015/0255385 A1 | 9/2015 | Lee et al. | |
| 2015/0255484 A1* | 9/2015 | Imamura | H01L 27/11582 257/314 |

(Continued)

*Primary Examiner* — Sitaramarao S Yechuri
(74) *Attorney, Agent, or Firm* — Harness, Dickey & Pierce P.L.C.

(57) ABSTRACT

In one embodiment, the semiconductor device includes a stack of alternating first interlayer insulating layers and gate electrode layers on a substrate. At least one of the gate electrode layers has a first portion and a second portion. The second portion forms an end portion of the at least one gate electrode layer, and a bottom surface of the second portion is at a lower level than a bottom surface of the first portion. A contact plug extends from the second portion.

18 Claims, 39 Drawing Sheets

(56) References Cited

U.S. PATENT DOCUMENTS

2015/0279856 A1  10/2015  Hyun et al.
2015/0287710 A1  10/2015  Yun et al.
2015/0318300 A1* 11/2015  Ohsaki ............... H01L 27/1157
                                            438/258
2016/0005759 A1   1/2016  Kim et al.

* cited by examiner

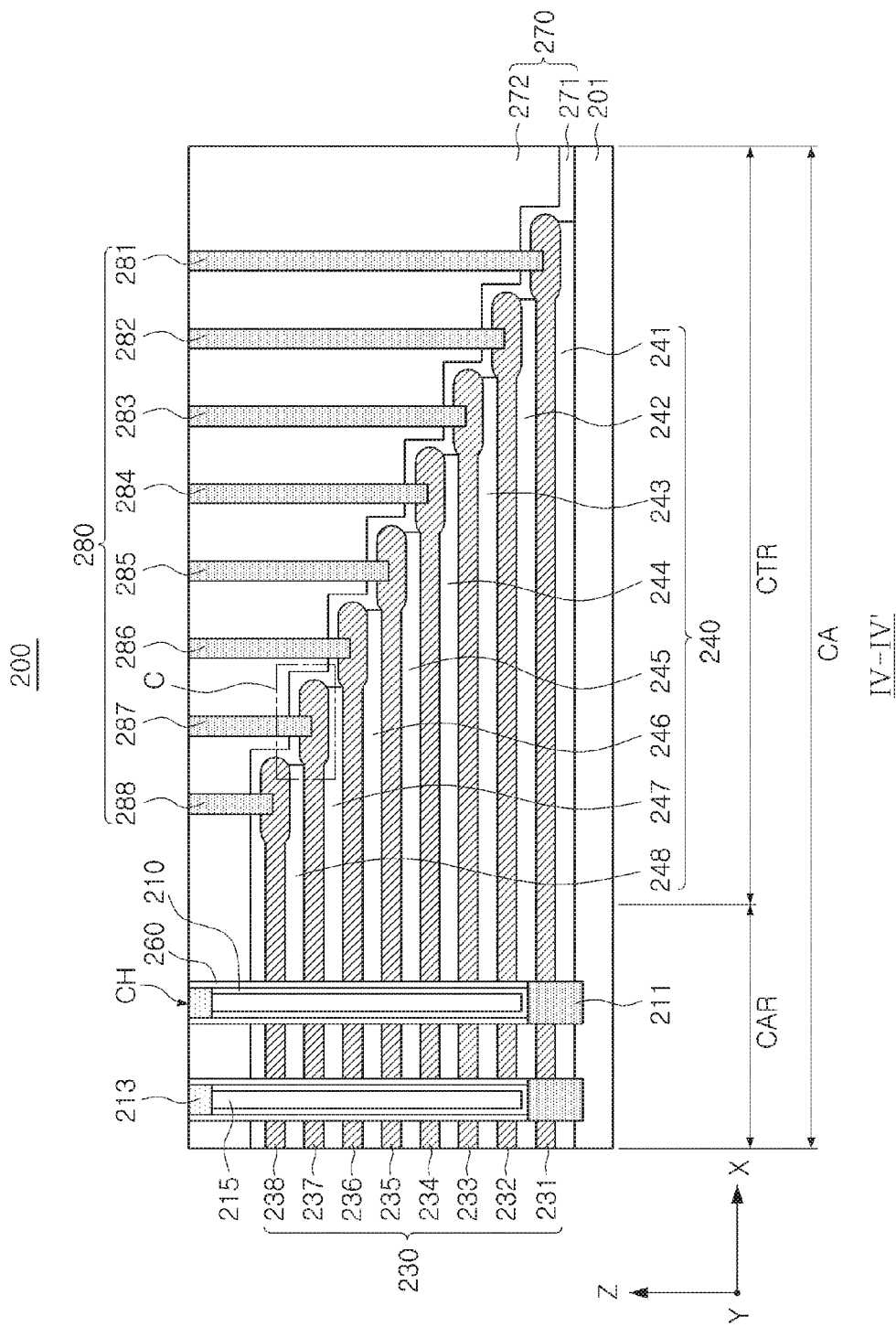

MEMORY DEVICE

CROSS-REFERENCE TO RELATED APPLICATION

This application claims the benefit of priority to Korean Patent Application No. 10-2016-0091328, filed on Jul. 19, 2016 with the Korean Intellectual Property Office, the entirety of which is incorporated herein by reference.

BACKGROUND

1. Field

The inventive concepts relate to a memory device.

2. Description of Related Art

Volumes of electronic products have gradually been reduced, while being required to process high capacity data. Thus, it would be beneficial to increase the integration of semiconductor memory devices used in such electronic products. As a method in which the integration of semiconductor memory devices may be increased, a memory device having a vertical transistor structure, rather than an existing planar transistor structure, has been proposed.

SUMMARY

At least one embodiment is directed to a semiconductor device.

In one embodiment, the semiconductor device includes a stack of alternating first interlayer insulating layers and gate electrode layers on a substrate. At least one of the gate electrode layers has a first portion and a second portion. The second portion forms an end portion of the at least one gate electrode layer, and a bottom surface of the second portion is at a lower level than a bottom surface of the first portion. A contact plug extends from the second portion.

At least one embodiment is directed to a method of manufacturing a semiconductor device.

In one embodiment, the method includes forming a stack of alternating first interlayer insulating layers and sacrificial layers on a substrate. Each of the sacrificial layers extends in a first direction less than a previous one of the sacrificial layers to define a landing portion of the previous one of the sacrificial layers. The method further includes implanting ions through at least one of the landing portions to an interface between a bottom surface of the at least one landing portion and one of the first interlayer insulating layers under the at least one landing portion; removing the sacrificial layers and some of the one of the first interlayer insulating layers under the at least one landing portion to form sacrificial layer removal space; and filling the sacrificial layer removal space with a conducting material to form gate electrode layers alternately stacked with the first interlayer insulating layers.

BRIEF DESCRIPTION OF DRAWINGS

The above and other aspects, features, and advantages of the present disclosure will be more clearly understood from the following detailed description taken in conjunction with the accompanying drawings, in which:

FIG. 7 is a schematic view of a memory device according to an example embodiment of the inventive concepts;

DETAILED DESCRIPTION

Hereinafter, some embodiments of the inventive concepts will be described with reference to the accompanying drawings.

Figure 1:
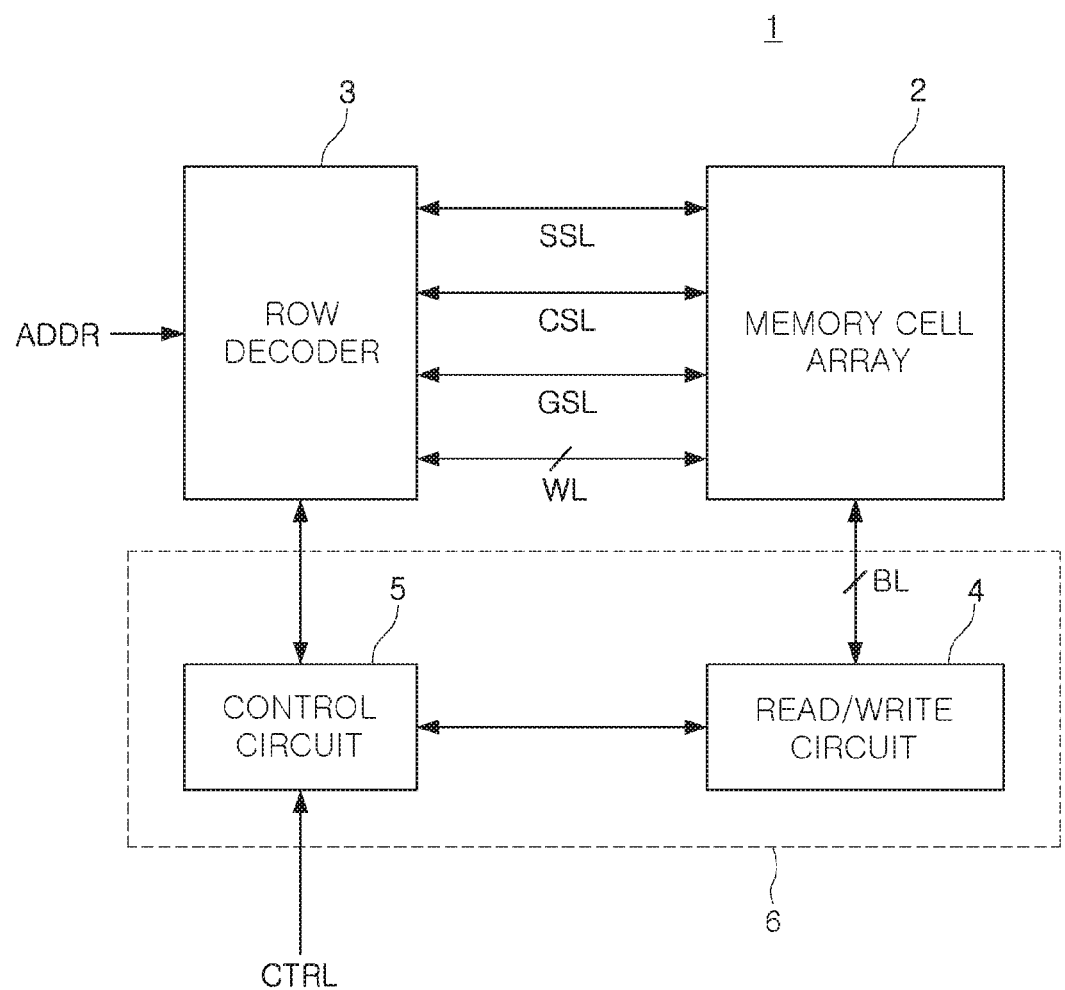
FIG. 1 is a schematic block diagram of a memory device according to an example embodiment of the inventive concepts.

With reference to FIG. 1, a memory device 1 according to an example embodiment may include a memory cell array 2, a row decoder 3, and a core logic circuit 6. The core logic circuit 6 may include a read/write circuit 4 and a control circuit 5.

The memory cell array 2 may include a plurality of memory cells arranged in a plurality of rows and a plurality of columns. The plurality of memory cells included in the memory cell array 2 may be connected to the row decoder 3 through word lines WL, a common source line CSL, a string select line SSL, a ground select line GSL, and the like, and may be connected to the read/write circuit 4 through a bit line BL. In an example embodiment of the present inventive concept, a plurality of memory cells arranged linearly in a single row may be connected to a single word line WL, and a plurality of memory cells arranged linearly in a single column may be connected to a single bit line BL.

The plurality of memory cells included in the memory cell array 2 may be divided into a plurality of memory blocks. A respective memory block may include a plurality of word lines WL, a plurality of string select lines SSL, a plurality of ground select lines GSL, a plurality of bit lines BL, and at least one common source line CSL.

The row decoder 3 may receive externally provided address information ADDR, and may decode the received address information ADDR to determine a signal to supply to at least a portion of the word lines WL, the common source line CSL, the string select line SSL, and the ground select line GSL connected to the memory cell array 2.

The read/write circuit 4 may select at least a portion of bit lines BL connected to the memory cell array 2 in response to a command provided from the control circuit 5. The read/write circuit 4 may read data written to a memory cell connected to the selected portion of bit lines BL, or may write data to a memory cell connected to the selected portion of bit lines BL. In order to perform operations as described above, the read/write circuit 4 may include a circuit such as a page buffer, an input/output buffer, a data latch, and the like.

The control circuit 5 may control operations of the row decoder 3 and the read/write circuit 4 in response to a control signal CTRL transferred externally. In the case of reading data written to the memory cell array 2, the control circuit 5 may control operations of the row decoder 3 to supply a voltage to a memory cell in which the data to be read is stored for a read operation, through the word line WL. When the voltage for a read operation is supplied through a specific word line WL, the control circuit 5 may perform controlling so that the read/write circuit 4 may read data written to a memory cell connected to the word line WL having received the voltage for a read operation.

In a different manner, for example, when data is written to the memory cell array 2, the control circuit 5 may control operations of the row decoder 3 to supply a voltage for a writing operation to a memory cell to which the data is to be written, through a word line WL. When the voltage for a writing operation is supplied through a specific word line WL, the control circuit 5 may control the read/write circuit 4 to write data to a memory cell connected to the word line WL to which the voltage for a writing operation has been supplied.

Figure 2:
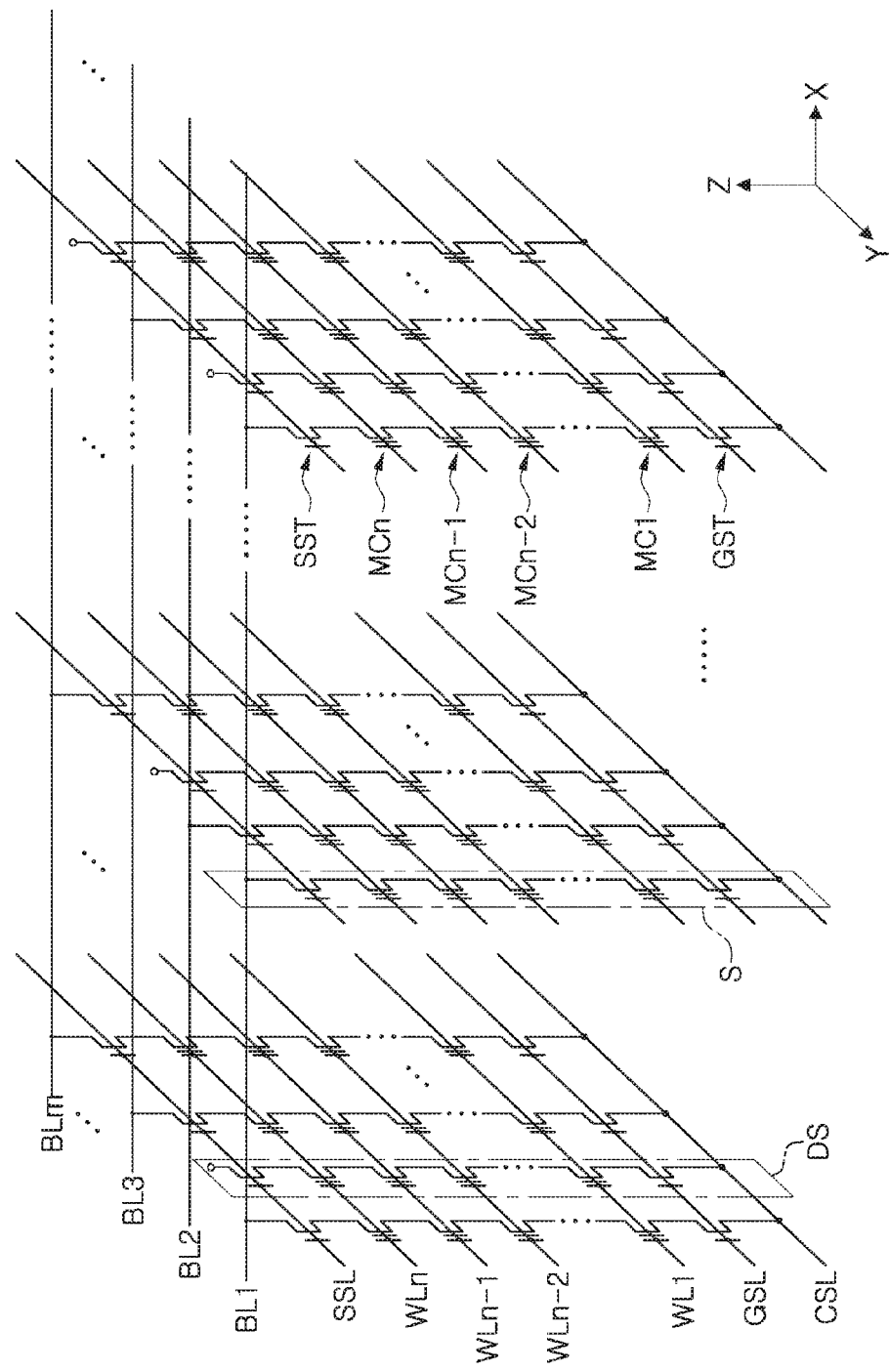
FIG. 2 is a circuit diagram of a memory cell array of a memory device according to an example embodiment of the inventive concepts.

FIG. 2 is an equivalent circuit diagram of a memory cell array of a memory device according to an example embodiment. A semiconductor device according to an example embodiment may be a vertical NAND flash device.

Referring to FIG. 2, a memory cell array may include a plurality of memory cell strings S including n number of memory cells MC1 to MCn connected to one another in series, and a ground selection transistor GST and a string select transistor SST connected to respective ends of the memory cells MC1 to MCn in series. N number of memory cells MC1 to MCn connected to one another in series may correspond to n number of word lines WL1 to WLn to select the memory cells MC1 to MCn, respectively. A dummy cell (not shown) may be further disposed between the ground selection transistor GST and a first memory cell MC1 and between the string select transistor SST and a nth memory cell MCn.

Gate terminals of the ground selection transistors GST may be connected to a ground select line GSL, and source terminals thereof may be connected to a common source line CSL. Gate terminals of the string select transistors SST may be connected to a string select line SSL, and source terminals thereof may be connected to drain terminals of memory cells MCn. Although FIG. 2 illustrates a structure in which one ground selection transistor GST and one string select transistor SST are respectively connected to the n number of memory cells MC1 to MCn connected to one another in series, in a manner different therefrom, a plurality of ground selection transistors GST and/or a plurality of string select transistors SST may also be connected thereto.

Drain terminals of the string select transistors SST may be connected to a plurality of bit lines BL1 to BLm. When a signal is applied to gate terminals of the string select transistors SST through the string select line SSL, the signal applied through the bit lines BL to BLm may be transferred to the n number of memory cells MC1 to MCn connected to one another in series, and thus, a data reading operation or a data writing operation may be performed. In addition, when a desired (or, alternatively a predetermined) level of erase voltage is applied thereto through a well region formed in a substrate, an erase operation in which data having been written to the memory cells MC1 to MCn is removed may be performed.

On the other hand, with reference to FIG. 2, the memory device according to an example embodiment may include at least one dummy string DS. The dummy string DS may be a string including a dummy channel electrically isolated from the bit lines BL1 to BLm.

Figure 3:
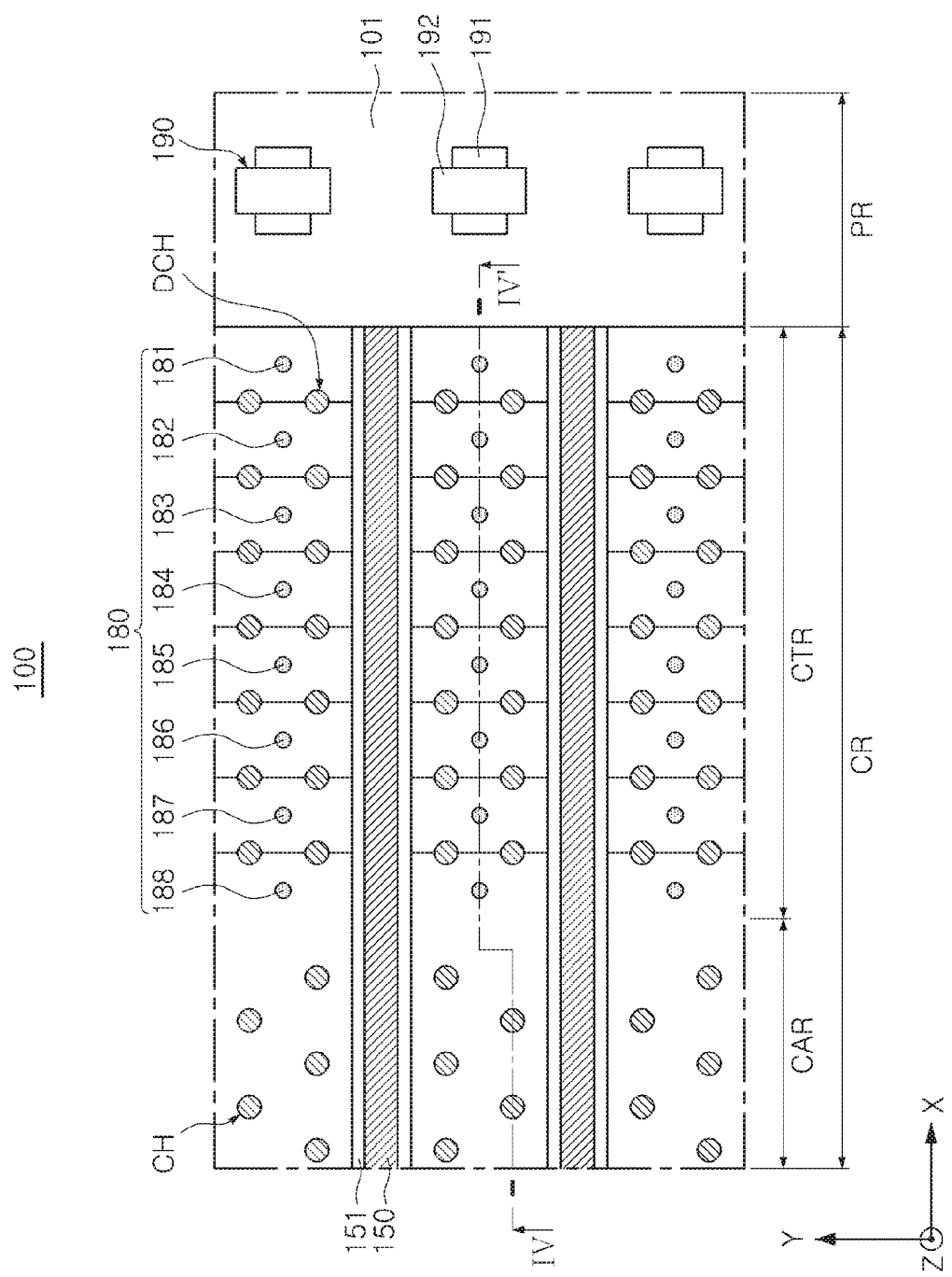
FIG. 3 is a schematic view of a memory device according to an example embodiment of the inventive concepts.

FIG. 3 is a schematic view of a memory device according to an example embodiment of the inventive concepts.

With reference to FIG. 3, a memory device 100 according to an example embodiment may include a cell region CR and a peripheral circuit region PR adjacent to the cell region CR. The cell region CR may include a plurality of channel structures CH and DCH extending in a direction perpendicular to an upper surface of a substrate 101, a plurality of gate electrode layers stacked on the substrate 101 and penetrated by the plurality of channel structures CH and DCH, a plurality of contacts 181 to 188 (contacts 180) connected to the plurality of gate electrode layers, and the like. The peripheral circuit region PR may include peripheral circuit devices 190 disposed on the substrate 101. The peripheral circuit devices 190 may be planar transistors, and may include an active region 191, a planar gate electrode 192, and the like.

In the example embodiment of FIG. 3, an upper surface of the substrate 101 may correspond to an X-Y plane, and the plurality of channel structures CH and DCH and the plurality of contacts 180 may extend in a direction perpendicular to an upper surface of the substrate 101, for example, a Z-axis direction of FIG. 3. The plurality of gate electrode layers connected to the plurality of contacts 180 may be stacked alternately with a plurality of insulating layers above an upper surface of the substrate 101, corresponding to the X-Y plane, in a Z-axis direction.

The plurality of channel structures CH and DCH may include a plurality of cell channel structures CH and a plurality of dummy channel structures DCH. The plurality of cell channel structures CH may have an internal structure the same as or different to that of the plurality of dummy channel structures DCH. The plurality of dummy channel structures DCH may not be connected to bit lines there above, which is different from the plurality of channel structures CH. Thus, in the plurality of dummy channel structures DCH, operations of data writing or data reading, and the like, may not be performed. The plurality of dummy channel structures DCH may be disposed to be adjacent to respective edges of the gate electrode layers to support the gate electrode layers, such that the gate electrode layers may be prevented from breaking or bending during a manufacturing process.

The plurality of channel structures CH may be spaced apart from each other on the X-Y plane. The number and disposition of the plurality of channel structures CH may be varied, according to example embodiments. For example, as illustrated in FIG. 3, the channel structures CH may be disposed in zig-zag form. In addition, the channel structures CH adjacent to each other with an isolation insulating layer 151 there between may be symmetrical to each other, respectively, but are not limited thereto.

The gate electrode layers, the channel structures CH, and the like may be divided into a plurality of regions by the common source lines 150 and the isolation insulating layers 151 disposed on sides of the common source lines 150. The plurality of regions defined by the common source lines 150 and the isolation insulating layers 151 may be respectively provided as a plane, a block, or the like of the memory device 100. The common source line 150 may be connected to a source region formed by allowing a portion of the substrate 101 to be doped with an impurity.

The gate electrode layers may provide a pad region in which the gate electrode layers extend by different lengths, in a first direction, for example, in an X-axis direction of FIG. 3, to have step structures. In the pad region, the gate electrode layers may have a stepped shape having step structures, and may be connected to the contacts 180. A region in which the pad region is provided may be provided as a contact region CTR in which the contacts 180 are connected to the gate electrode layers, and the cell region CR may include a cell array region CAR and the contact region CTR. The contact region CTR may be disposed between the cell array region CAR and the peripheral circuit region PR.

In order to increase a capacity of the memory device 100, the number of gate electrode layers in the stack may be increased. In this case, if a thickness of each of the gate electrode layers is not appropriately limited, an overall thickness of a gate structure including the gate electrode layers may be excessively increased. The gate structure having a relatively increased thickness may increase the difficulty of a process of forming the channel structures CH and DCH and the contacts 180. Thus, in order to increase a capacity of the memory device 100 without increasing the difficult of a process, a thickness of each of the gate electrode layers may be reduced to limit an overall thickness of a gate structure. However, in a case in which the thickness of each of the gate electrode layers is reduced, at least a portion of the contacts 180 may penetrate through the gate electrode layer to be connected to other gate electrode layers, which may cause the occurrence of defects such as short circuits.

In an example embodiment of the inventive concepts, as a thickness of each of the gate electrode layers may be increased only in a pad region in which the contacts 180 are connected to the gate electrode layers, the problem described as above may be mitigated or solved. A description thereof will be provided below with reference to FIG. 4.

Figure 4:
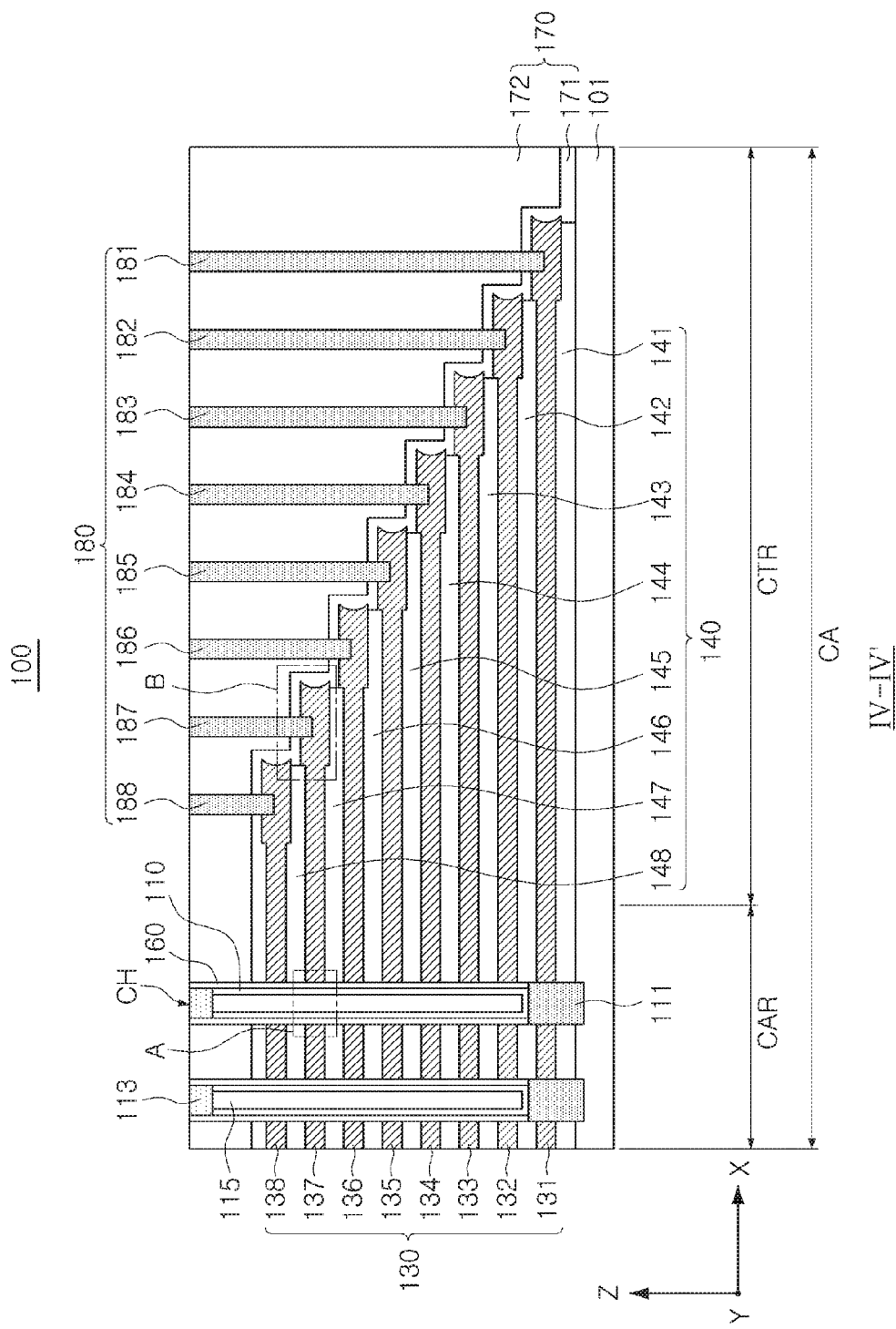
FIG. 4 is a cross-sectional view of a memory device taken along line IV-IV' of FIG. 3.

FIG. 4 is a cross-sectional view of a memory device taken along line IV-IV' of FIG. 3.

With reference to FIG. 4, a memory device 100 according to an example embodiment may include a plurality of gate electrode layers 131 to 138 (gate electrode layers 130) and a plurality of insulating layers 141 to 148 (insulating layers 140), alternately stacked on an upper surface of a substrate 101. The gate electrode layers 130 may form a plurality of pairs, with insulating layers 140 adjacent thereto in a stack direction (Z-axis direction), respectively. Namely, an insulating layer 140 and the gate electrode 130 disposed thereon form a pair. The plurality of pairs may respectively extend by different lengths in a first direction (X-axis direction). With reference to FIG. 4, a plurality of pad regions may be provided due to the pairs extending by different lengths in the first direction. The contacts 180 may be connected to the gate electrode layers 130 in the pad regions, respectively.

An interlayer insulating layer 170 may be provided on the gate electrode layers 130, and include an insulating material such as a silicon oxide or the like. The interlayer insulating layer 170 may include first and second interlayer insulating layers 171 and 172. The second interlayer insulating layer 172 may have a greater thickness or volume than that of the first interlayer insulating interlayer 171. The plurality of channel structures CH and DCH and the contacts 180 may penetrate through the interlayer insulating layer 170.

The cell channel structure CH may penetrate through the gate electrode layers 130 and the insulating layers 140 to extend to an upper surface of the substrate 101. In one example embodiment, the cell channel structure CH may also extend into at least a portion of the substrate 101 disposed there below. The cell channel structure CH may include a channel layer 110, an epitaxial layer 111, a bit line pad 113, an embedded insulating layer 115, a gate insulating layer 160, and the like. The gate insulating layer 160 may be provided between the channel layer 110 and the gate electrode layer 130 and may include a plurality of layers. Hereinafter, a structure of the cell channel structure CH will be described in detail with reference to FIG. 5.

Figure 5:
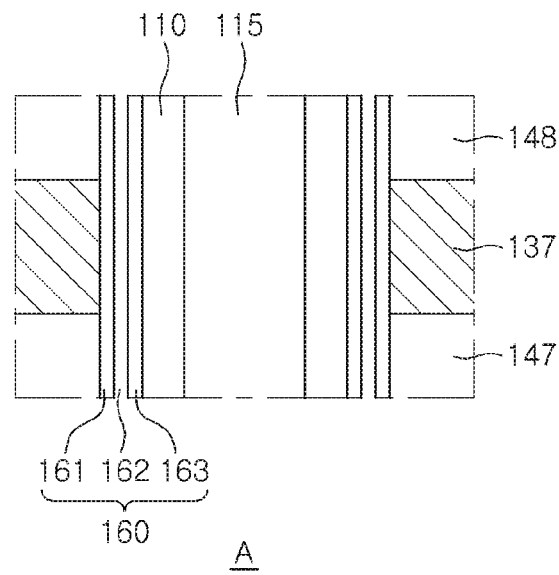
FIG. 5 is an enlarged view of region A of FIG. 4.

FIG. 5 is an enlarged view of region A of FIG. 4. With reference to FIG. 5, the cell channel structure CH may include an embedded insulating layer 115, the channel layer 110 disposed on an outer surface of the embedded insulating layer 115, the gate insulating layer 160, and the like. The channel layer 110 may be formed in a cavity having a circular cross-sectional shape, and may have a hollow cylinder shape. A space formed in the center of the channel layer 110 may be filled by the embedded insulating layer 115, and the bit line pad 113 may be formed at one end on the channel layer 110. The bit line pad 113 may be connected to a bit line to be provided as drain regions of a plurality of memory cell devices formed in the cell array region CAR.

The gate insulating layer 160 including a blocking layer 161, a charge storage layer 162, a tunneling layer 163, and the like may be disposed between the channel layer 110 and the gate electrode layer 130. At least a portion of the blocking layer 161, the charge storage layer 162, and the tunneling layer 163 may be surrounded by the gate electrode layers 130 according to a structure of the memory device 100.

The blocking layer 161 may include silicon oxide ($SiO_2$), silicon nitride ($Si_3N_4$), silicon oxynitride (SiON) or a high-k dielectric material. The high-k dielectric material may be any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), hafnium lanthanum oxide ($LaHf_xO_y$), hafnium aluminum oxide ($HfAl_xO_y$), and praseodymium oxide ($Pr_2O_3$). In a case in which the blocking layer 161 includes a high-k dielectric material, the term 'high-k dielectric constant' may be defined to have the meaning that permittivity of the blocking layer 161 is higher than that of the tunneling layer 163 or higher than that of silicon oxide.

Selectively, the blocking layer 161 may include a plurality of layers having different dielectric constants. In this case, as a layer having a relatively low dielectric constant is disposed more adjacent to the channel layer 110 than a layer having a relatively high dielectric constant thereto, memory device characteristics, such as erase characteristics, may be improved by controlling an energy band having a level equal to a barrier level.

The charge storage layer 162 may be a charge trap layer or a floating gate conductive layer. For example, when the charge storage layer 162 is a floating gate, the charge storage layer 162 may be formed by depositing polysilicon using low pressure chemical vapor deposition (LPCVD). For example, when the charge storage layer 162 is a charge trap layer, the charge storage layer 162 may include at least one of silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide (HfAl$_x$O$_y$), hafnium tantalum oxide (HfTa$_x$O$_y$), hafnium silicon oxide (HfSi$_x$O$_y$), aluminum nitride (Al$_x$N$_y$), and aluminum gallium nitride (AlGa$_x$N$_y$).

The tunneling layer 163 may include at least one of silicon oxide (SiO$_2$), silicon nitride (Si$_3$N$_4$), silicon oxynitride (SiON), hafnium oxide (HfO$_2$), hafnium silicon oxide (HfSi$_x$O$_y$), aluminum oxide (Al$_2$O$_3$), and zirconium oxide (ZrO$_2$).

On the other hand, as described above, although integration of the memory device 100 may be improved by reducing individual thicknesses of the gate electrode layers 130, a problem in which the contacts 180 penetrate through the gate electrode layers 130 may occur. In order to mitigate or solve such a problem according to some example embodiments, the gate electrode layers 130 may respectively have a relatively great thickness only in the pad region as illustrated in FIG. 4, which will be described in detail with reference to FIG. 6, below.

Figure 6:
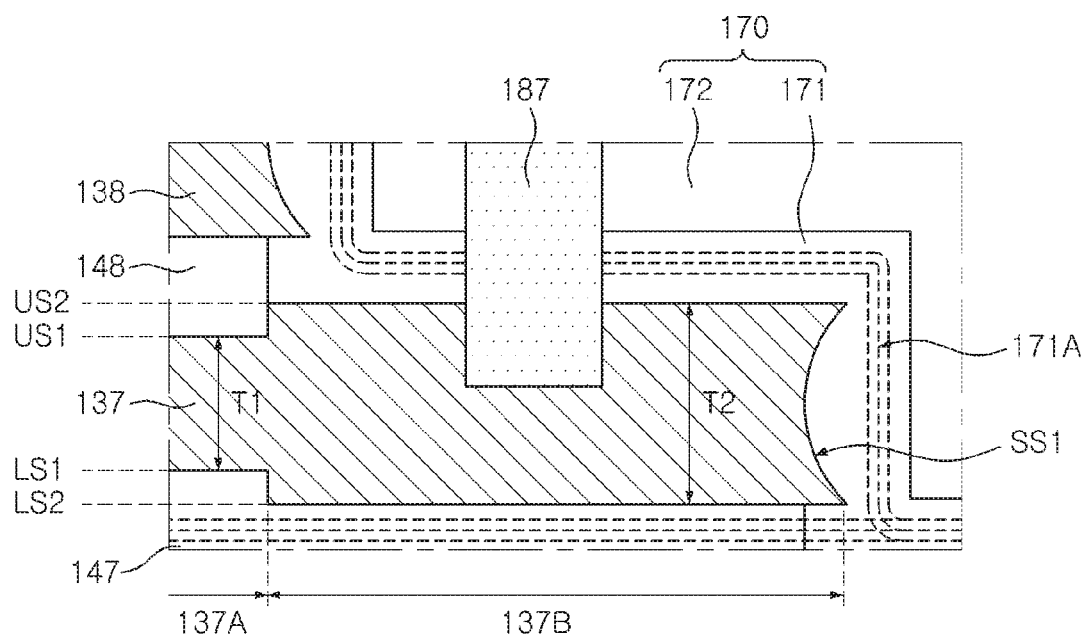
FIG. 6 is an enlarged view of region B of FIG. 4.

FIG. 6 is an enlarged view of region B of FIG. 4. In an example embodiment, each of the gate electrode layers 130 may have a different thickness at at least a portion of the gate electrode layer. With reference to FIG. 6, a seventh gate electrode layer 137 may include a first region or portion 137A and a second region or portion 137B extending from the first region 137A. The second region 137B may be provided as a pad region or portion where the gate electrode layer 137 is connected to a contact 187. A thickness T2 of the second region 137B may be greater than a thickness T1 of the first region 137A.

With reference to FIG. 6, an upper surface US2 of the second region 137B may be disposed to be higher than an upper surface US1 of the first region 137A, and a lower surface LS2 of the second region 137B may be disposed to be lower than a lower surface LS1 of the first region 137A. A positional relationship between the first region 137A and the second region 137B respectively having the upper surfaces US1 and US2 and the lower surfaces LS1 and LS2 may be determined according to a manufacturing process of the memory device 100.

A lateral surface SS1 between the upper surface US2 and the lower surface LS2 of the second region 137B may have a concave shape recessed inwardly in the first direction (X-axis direction). Such a concave shape of the lateral surface SS1 may be formed by doping the upper and lower surfaces of sacrificial layers and respective interlayer insulating layers with an impurity during a process of manufacturing the memory device 100. As a result, the gate electrode layers 130 may extend further than the respective insulating layers forming pairs therewith in the first direction, while being adjacent thereto in a stack direction, respectively. With reference to FIG. 6, the seventh gate electrode layer 137 may extend further than a seventh insulating layer 147 disposed there below and forming a pair therewith, in the first direction.

In order to form the second region 137B having a thickness greater than that of the first region 137A, upper and lower surfaces of sacrificial layers and respective interlayer insulating layers may be doped with an impurity in the manufacturing process. The impurity doped on the upper and lower surfaces of the sacrificial layers and respective interlayer insulating layers may be spread due to heat applied thereto in a subsequent process. Thus, a doped region 171A in which the impurity partially remains may be formed inside of a first interlayer insulating layers 171 as illustrated in FIG. 6. The doped region 171A may be located on upper surfaces, lower surfaces, and/or lateral surfaces of the gate electrode layers 130.

FIG. 7 is a schematic view of a memory device according to an example embodiment of the inventive concepts.

With reference to FIG. 7, a memory device 200 according to an example embodiment may include a cell array region CAR and a contact region CTR in a cell region CR. A plurality of cell channel structures CH may be disposed in the cell array region CAR. The cell channel structure CH may include an epitaxial layer 211 connected to a substrate 201, a channel layer 210, a bit line pad 213, an embedded insulating layer 215, a gate insulating layer 260, and the like.

A plurality of gate electrode layers 231 to 238 (gate electrode layers 230) may be connected to a plurality of contacts 281 to 288 (contacts 280) in the contact region CTR. In addition, the gate electrode layers 230 may extend in a first direction (X-axis direction), while forming a pair with one of a plurality of insulating layers 241 to 248 (240) adjacent thereto in a stack direction (Z-axis direction), respectively, to thus provide a plurality of pad regions.

In the example embodiment illustrated in FIG. 7, each of the gate electrode layers 230 may have a relatively great thickness in the pad region. In this case, thus, the problem in which the contacts 280 may penetrate through the gate electrode layers 230 in the pad region, occurring in the case that the gate electrode layers 230 respectively have a relatively small thickness, may be mitigated or solved, and the integration and reliability of the memory device 200 may be improved. A description thereof will be provided below with reference to FIG. 8A.

Figure 8A:
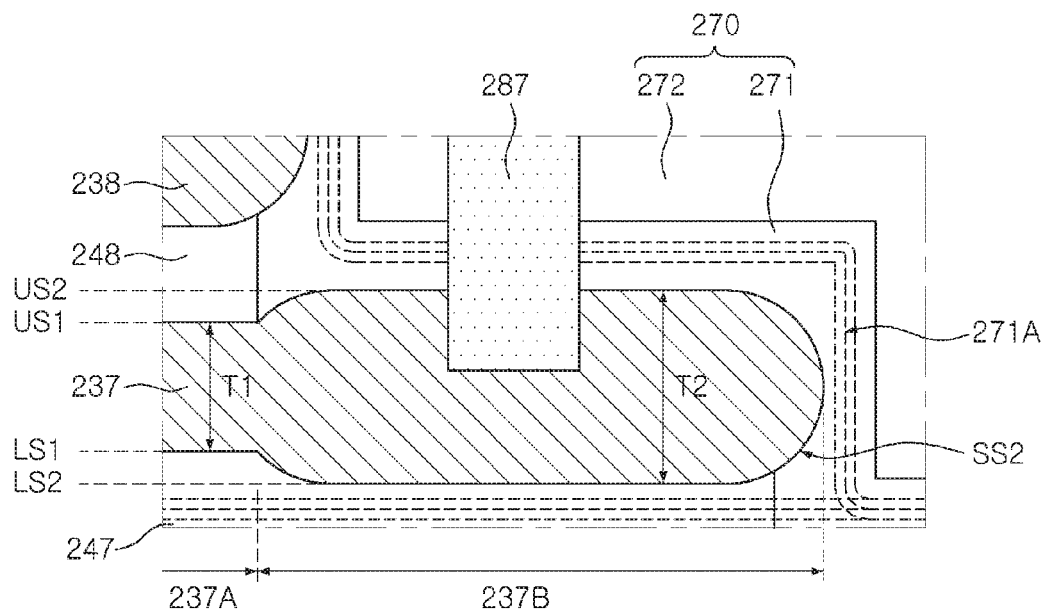
FIG. 8A is an enlarged view of region C of FIG. 7.

FIG. 8A is an enlarged view of region C of FIG. 7. With reference to FIG. 8A, a seventh gate electrode layer 237 may include a first region 237A and a second region 237B. The second region 237B may be provided as a pad region extending from the first region 237A, and a thickness T2 of the second region 237B may be greater than a thickness T1 of the first region 237A. In addition, in a manner similar to the example embodiment with reference to FIG. 6, an upper surface US2 of the second region or portion 237B may be disposed to be higher than an upper surface US1 of the first region or portion 237A, and a lower surface LS2 of the second region 237B may be disposed to be lower than a lower surface LS1 of the first region 237A.

In the example embodiment illustrated in FIG. 8A, the second region 237B may have a lateral surface SS2 protruding outwardly therefrom in the first direction (X-axis direction). For example, the lateral surfaces SS2 may be convex or have a bull nose shape. As interfaces at middle regions of sacrificial layers and respective interlayer insulating layers are doped with an impurity to be diffused in a process of manufacturing the memory device 200, the gate electrode layers 230 may have lateral surfaces SS2 having a convex shape.

On the other hand, a first interlayer insulating layer 271 may include a doped region 271A containing an impurity. The doped region 271A may be a region in which the impurity, having been injected into the interface, is diffused and remains during the manufacturing process of the memory device 200. The doped region 271A may be disposed on upper surfaces and lateral surfaces of the gate electrode layers 230. In an example embodiment, the doped region 271A present on lateral surfaces of the gate electrode layers 230 may have a relatively high impurity concentration.

In FIG. 8A, the first difference between upper surface US2 and upper surface US1 is the same as the second difference between the lower surface LS2 and the lower surface LS1.

Figure 8B:
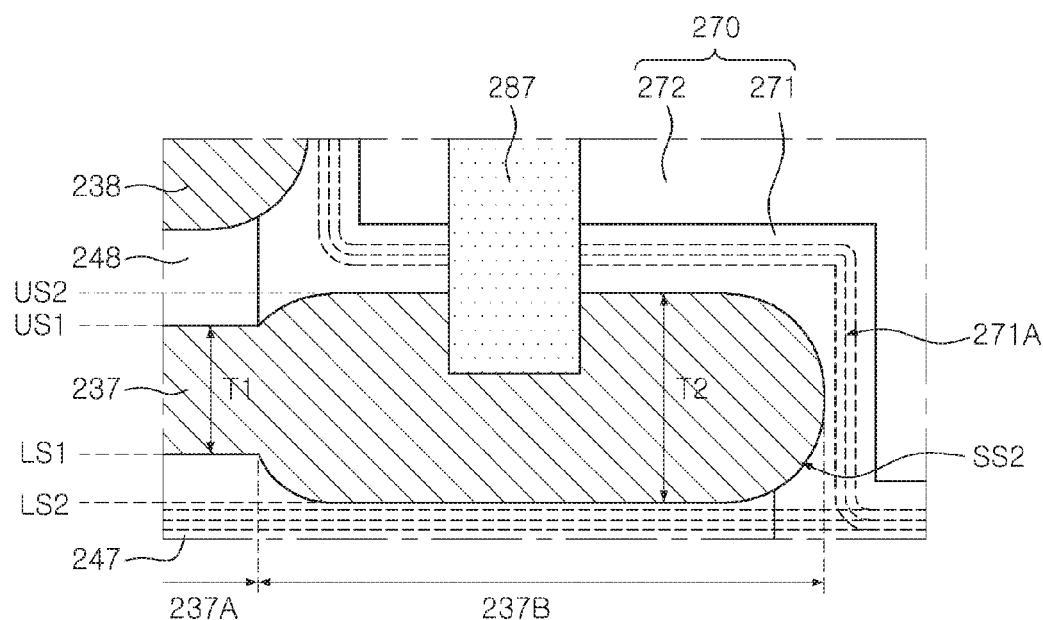
FIG. 8B is an enlarged view of region C of FIG. 7.

However, the second difference may be greater or less than the first difference. FIG. 8B illustrates the example where the second difference is greater than the first difference.

Figure 9:
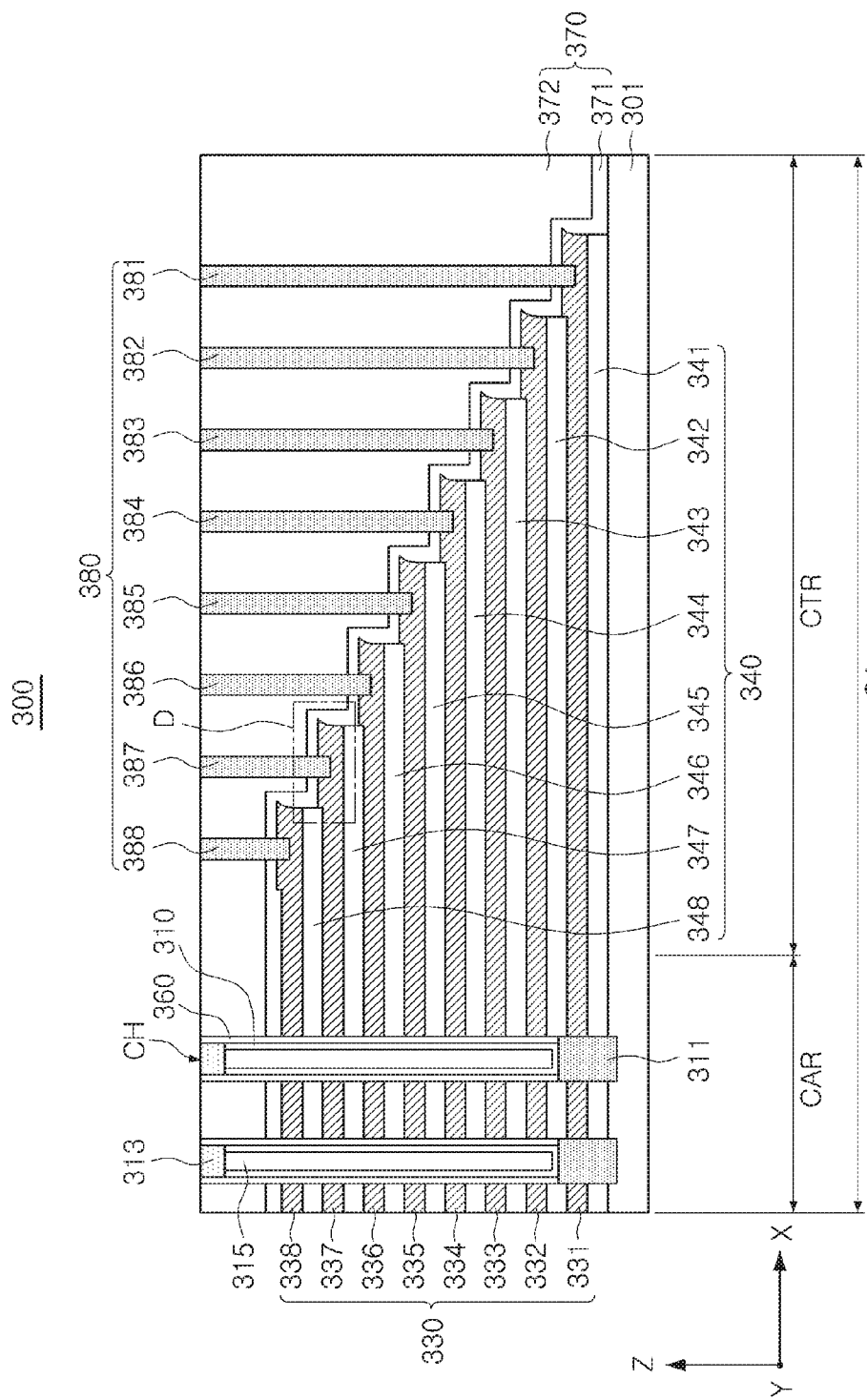
FIG. 9 is a schematic view of a memory device according to an example embodiment of the inventive concepts.

FIG. 9 is a schematic view of a memory device according to an example embodiment of the inventive concepts.

With reference to FIG. 9, a memory device 300 according to an example embodiment may include a plurality of gate electrode layers 331 to 338 (gate electrode layers 330) and a plurality of insulating layers 341 to 348 (insulating layers 340), alternately stacked on a substrate 301. A plurality of cell channel structures CH may be disposed in a cell array region CAR to penetrate through the gate electrode layers 330 and the insulating layers 340, and may include a channel layer 310, a gate insulating layer 360, an embedded insulating layer 315, a bit line pad 313, an epitaxial layer 311, and the like. An interlayer insulating layer 370 may be provided on the gate electrode layers 330, and the interlayer insulating layer 370 may include first and second interlayer insulating layers 371 and 372.

Figure 10:
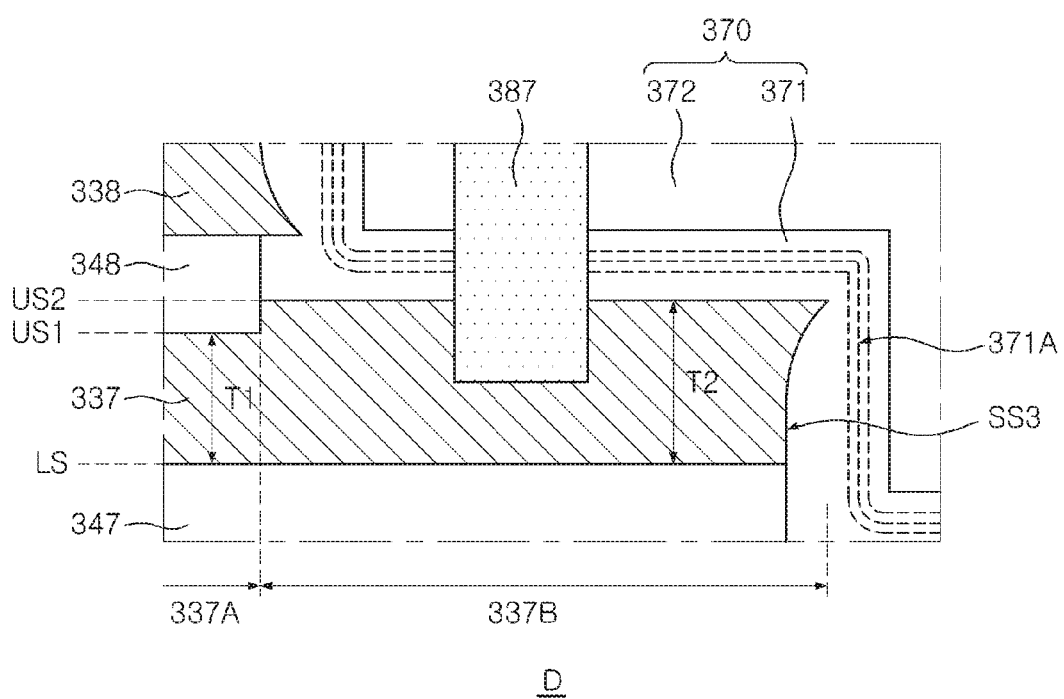
FIG. 10 is an enlarged view of region D of FIG. 9.

FIG. 10 is an enlarged view of region D of FIG. 9. With reference to FIG. 10, a seventh gate electrode layer 337 may include a first region 337A and a second region 337B. The second region 337B may be provided as a pad region connected to a contact 387, and a thickness T2 of the second region 337B may be greater than a thickness T1 of the first region 337A.

In a manner different from the foregoing example embodiments, in an example embodiment illustrated in FIG. 10, the second region 337B and the first region 337A may have a coplanar lower surface. For example, a thickness of the second region 337B may only be increased upwardly in a stack direction. An upper surface US2 of the second region 337B may be disposed to be higher than an upper surface US1 of the first region 337A. The thickness T2 of the second region 337B may be increased according to a positional relationship between the upper surfaces US1 and US2, which may be structural characteristics represented from a difference in a process of injecting an impurity at an interface between a sacrificial layer and interlayer insulating layer during the manufacturing process of the memory device 300.

A length of the upper surface US2 of the second region 337B may be greater than that of a lower surface LS thereof. Thus, a lateral surface SS3 of the second region 337B may have a recessed shape gently curving inward as illustrated in FIG. 10. A doped region 371A in which an impurity partially remains may be formed inside of a first interlayer insulating layer 371, and the doped region 371A may be distributed along a boundary surface between the first interlayer insulating layer 371 and the second interlayer insulating layer 372.

Figure 11:
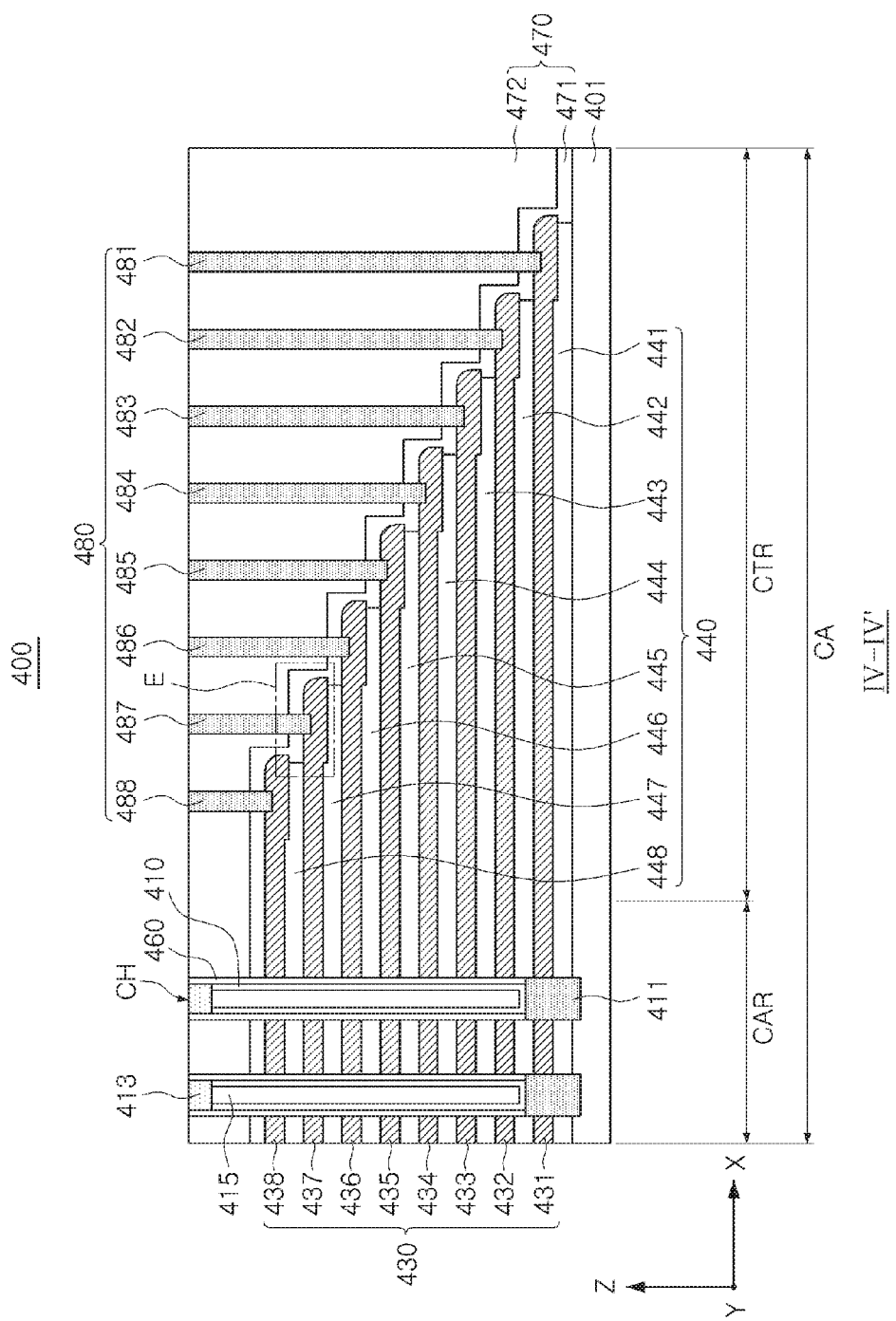
FIG. 11 is a schematic view of a memory device according to an example embodiment of the inventive concepts.

FIG. 11 is a schematic view of a memory device according to an example embodiment.

With reference to FIG. 11, a memory device 400 may include a plurality of gate electrode layers 431 to 438 (gate electrode layers 430) and a plurality of insulating layers 441 to 448 (insulating layers 440) stacked on a substrate 401. In addition, the memory device 400 may include a cell channel structure CH penetrating through gate electrode layers 430 in a cell array region CAR, and a plurality of contacts 481 to 488 (contacts 480) connected to the gate electrode layers 430 in a contact region CTR.

Figure 12:
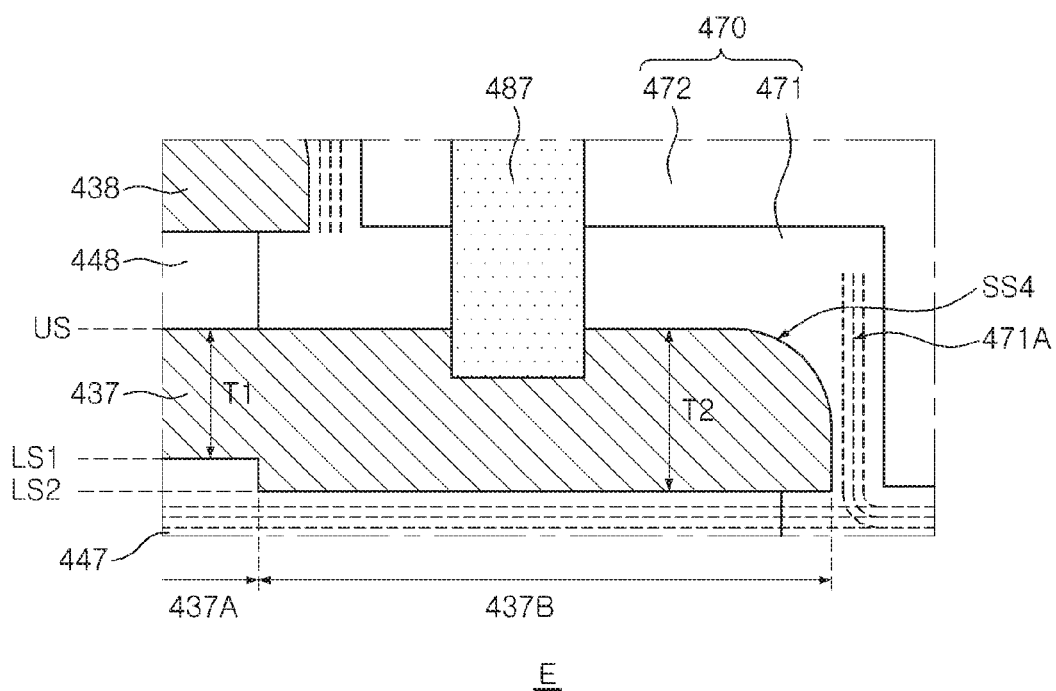
FIG. 12 is an enlarged view of region E of FIG. 11.

FIG. 12 is an enlarged view of region E of FIG. 11. In an example embodiment of FIG. 12, a seventh gate electrode layer 437 may include a first region or portion 437A and a second region or portion 437B extending from the first region 437A. A thickness T2 of the second region 437B may be greater than a thickness T1 of the first region 437A, which results from a configuration in which a lower surface LS2 of the second region 437B is disposed to be lower than a lower surface LS1 of the first region 437A. For example, an upper surface US of the first region 437A and the second region 437B may be provided as a single flat surface, and the first region 437A and the second region 437B may have a difference in thicknesses due to a step between lower surfaces LS1 and LS2 thereof.

The structure in the example embodiment illustrated in FIG. 12 may be provided by only doping a lower portion of a pad region of an interface between a sacrificial layer and interlayer insulating layer with an impurity in the manufacturing process of the memory device 400. In addition, in a manner different from the foregoing example embodiment, a doped region 471A having a residual impurity inside a first interlayer insulating layer 471 may be exhibited only on outer lateral surfaces of the gate electrode layers 430, which results due to an interface between sacrificial layers and the first interlayer insulating layer 471 not being doped with an impurity during the manufacturing process of the memory device 400. Due to this difference in processes, a lateral surface SS4 of the second region 437B may have a curved shape which gradually protrudes outwardly thereof. Namely, the lateral surface 554 may have a half bull nose shape.

FIGS. 13 to 39 are drawings illustrating a method of manufacturing a memory device according to an example embodiment. FIGS. 13 to 29 are drawings illustrating a method of manufacturing the memory device 100 according to the example embodiment with reference to FIGS. 3 to 6. FIGS. 30 to 39 are drawings illustrating a method of manufacturing the memory device 200 according to the example embodiment with reference to FIGS. 7 and 8.

Figure 13:
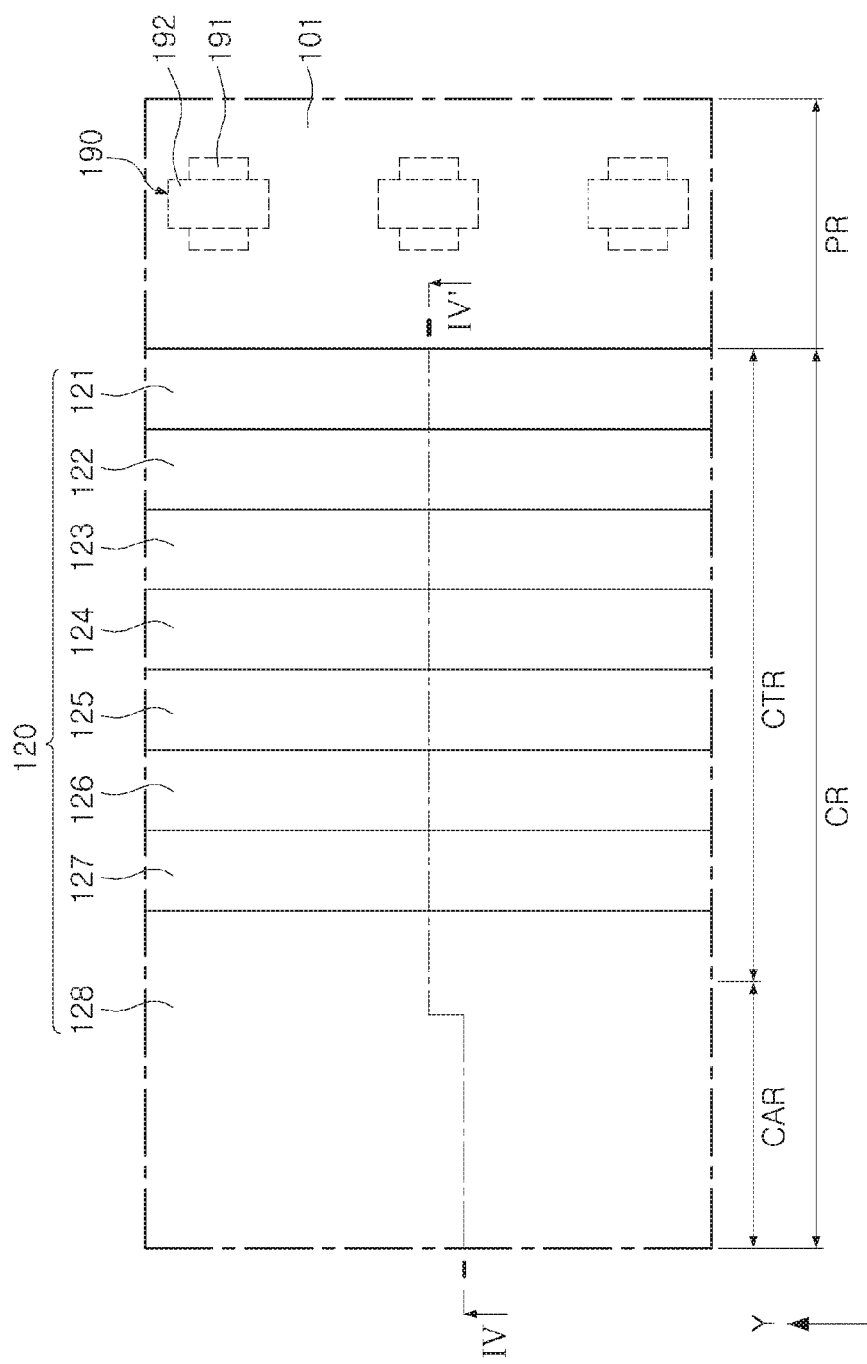
FIGS. 13 to 39 are drawings illustrating a method of manufacturing a memory device according to an example embodiment of the inventive concepts.
Figure 14:
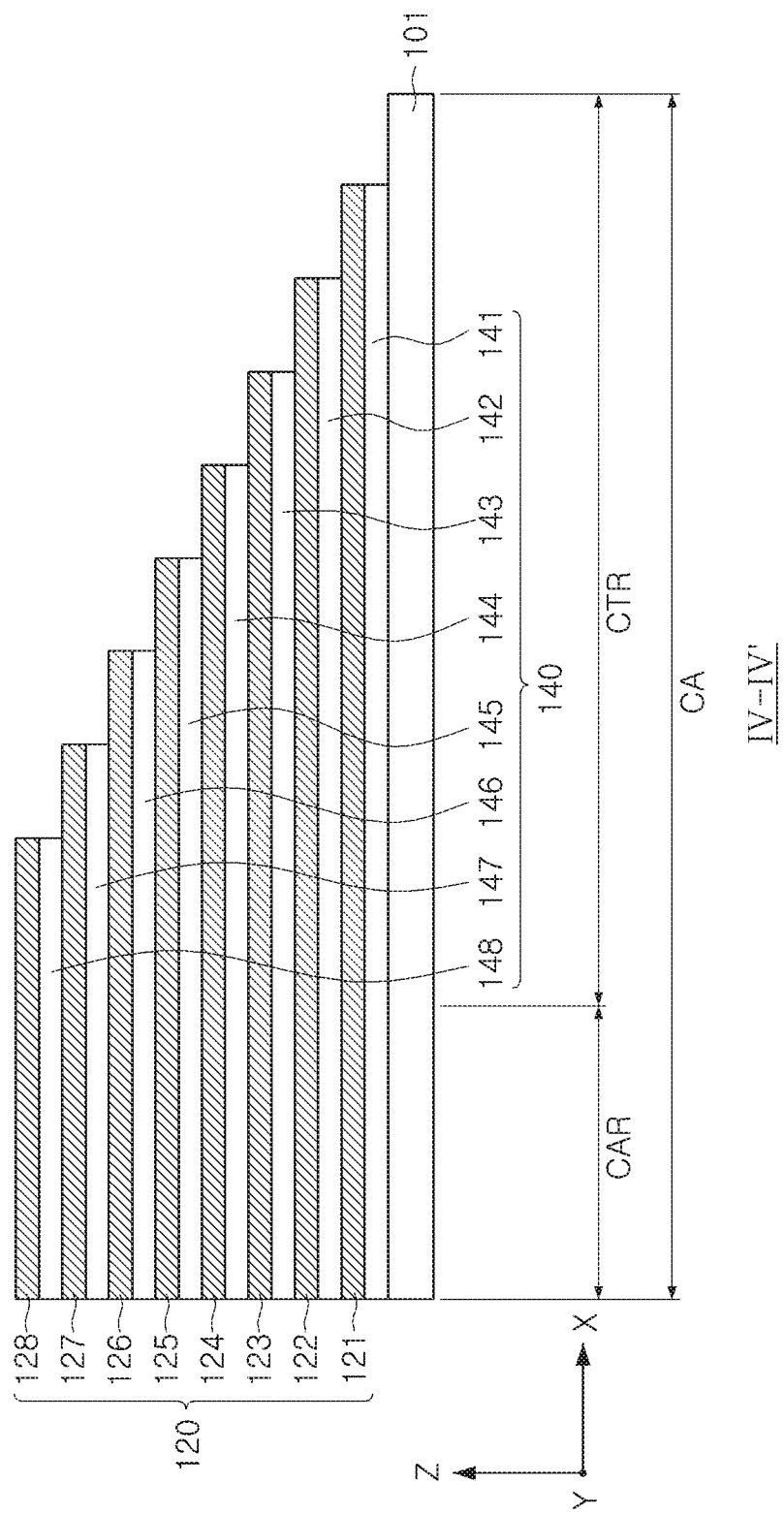

First, in FIGS. 13 and 14, FIG. 14 is a cross-sectional view taken along line IV-IV' of FIG. 13, which is the same line IV-IV' shown in FIG. 3. With reference to FIGS. 13 and 14, a plurality of sacrificial layers 121 to 128 (sacrificial layers 120) and a plurality of insulating layers 141 to 148 (insulating layers 140) may be alternately stacked on an upper surface of a substrate 101. The sacrificial layers 120 may extend in a first direction (X-axis direction), while forming pairs with the insulating layers 140 adjacent thereto in a stack direction (Z-axis direction), respectively. The pairs provided by the sacrificial layers 120 and the insulating layers 140 may extend by different lengths in the first direction to form a step structure as illustrated in FIGS. 13 and 14.

With reference to FIGS. 13 and 14, a plurality of pad regions may be provided in a step structure. By forming the pad regions, at least portions of the sacrificial layers 120 may be exposed externally. A desired (or, alternatively a predetermined) mask layer may be formed on the sacrificial layers 120 and the insulating layers 140 alternately stacked on the substrate 101, and portions of the sacrificial layers 120 and the insulating layers 140, exposed by the mask layer, may be etched. A process in which portions of the sacrificial layers 120 and the insulating layers 140, exposed by the mask layer, are etched while trimming the mask layer may be performed a plurality of times, thereby forming a structure as illustrated in FIGS. 13 and 14. In one example embodiment, the sacrificial layers 120 may be located on the insulating layers 140 in respective pad regions.

The sacrificial layers 120 and the insulating layers 140 may be formed of a material having a desired (or, alternatively a predetermined) etching selectivity. This etching selectivity may be quantitatively expressed by the ratio of an etching rate of the sacrificial layers 120 with respect to an etching rate of the insulating layers 140. For example, the insulating layers 140 may be provided as at least one of a silicon oxide film and a silicon nitride film, and the sacrificial layers 120 may be formed of a material selected from materials of a silicon film, a silicon oxide film, a silicon carbide film, and a silicon nitride film, in detail, a material different from that of the insulating layers 140. For example, when the insulating layers 140 are provided as silicon oxide layers, the sacrificial layers 120 may be silicon nitride layers.

Figure 15:
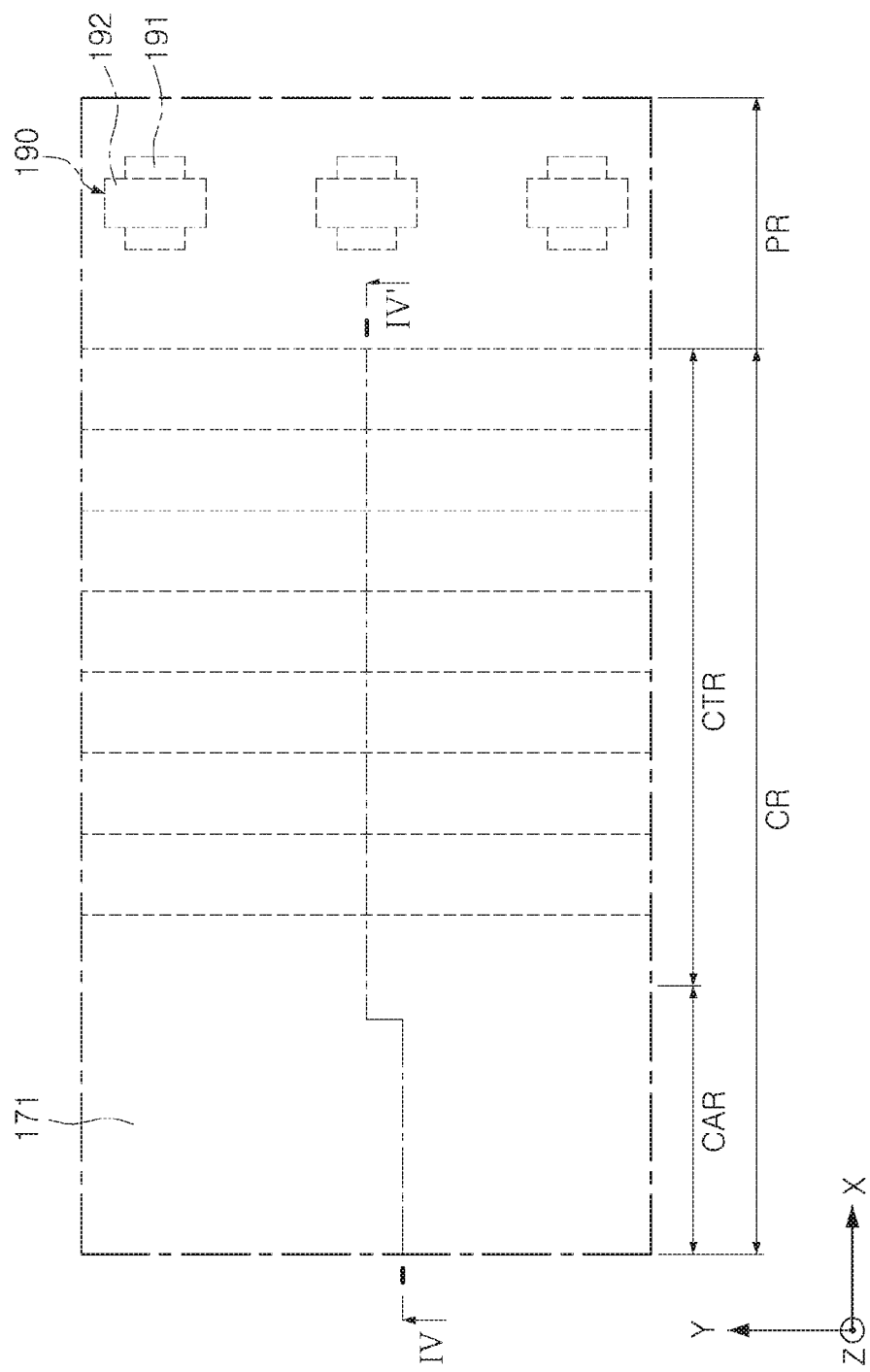
Figure 16:
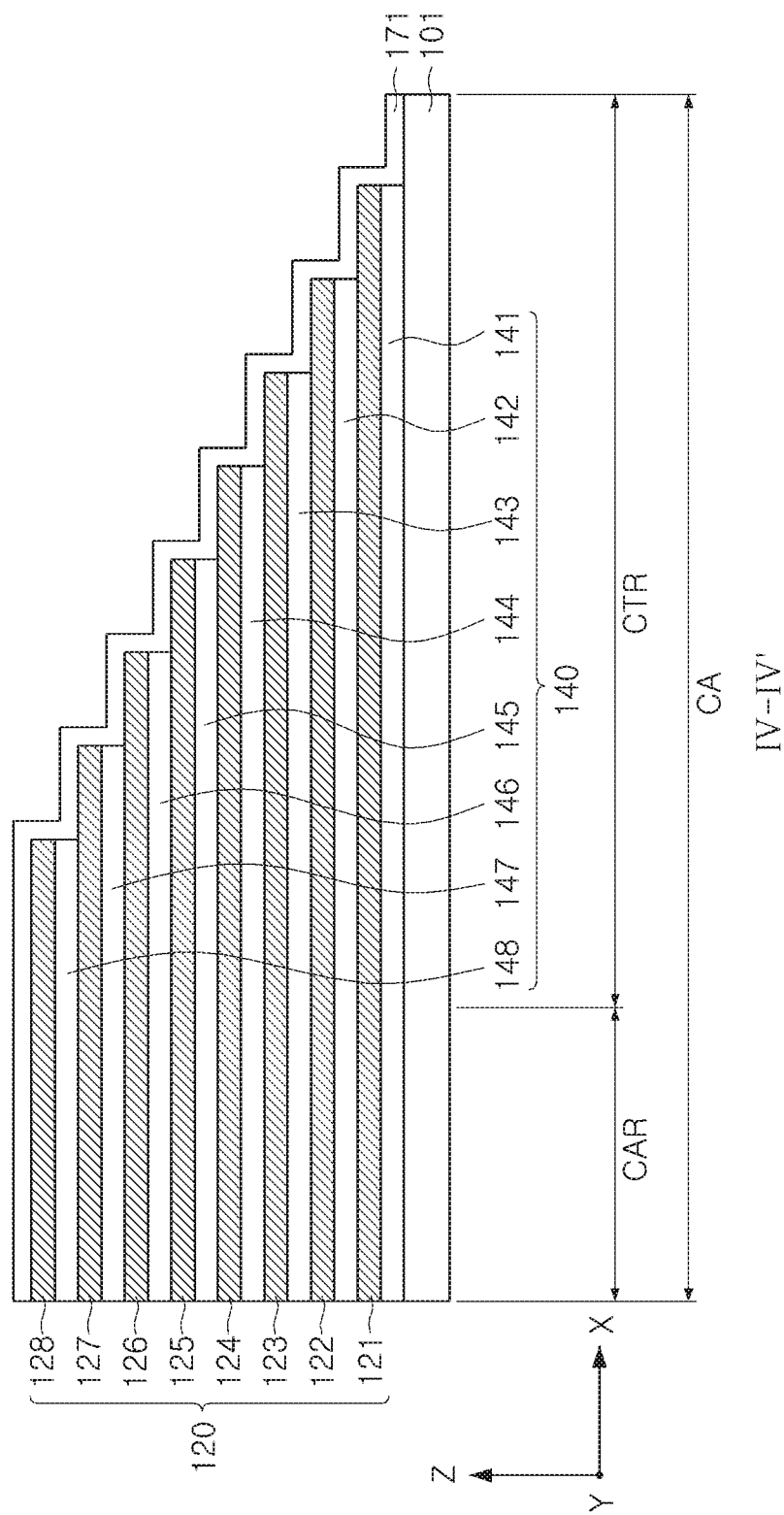

Referring to FIGS. 15 and 16, a first interlayer insulating layer 171 may be formed on the sacrificial layers 120. The first interlayer insulating layer 171 may extend to a peripheral circuit region PR and cover peripheral circuit devices 190. The first interlayer insulating layer 171 may be formed of silicon oxide, and may be configured of a high-density plasma (HDP) oxide film or a tetra-ethyl-ortho-silicate (TEOS) oxide film.

Figure 17:
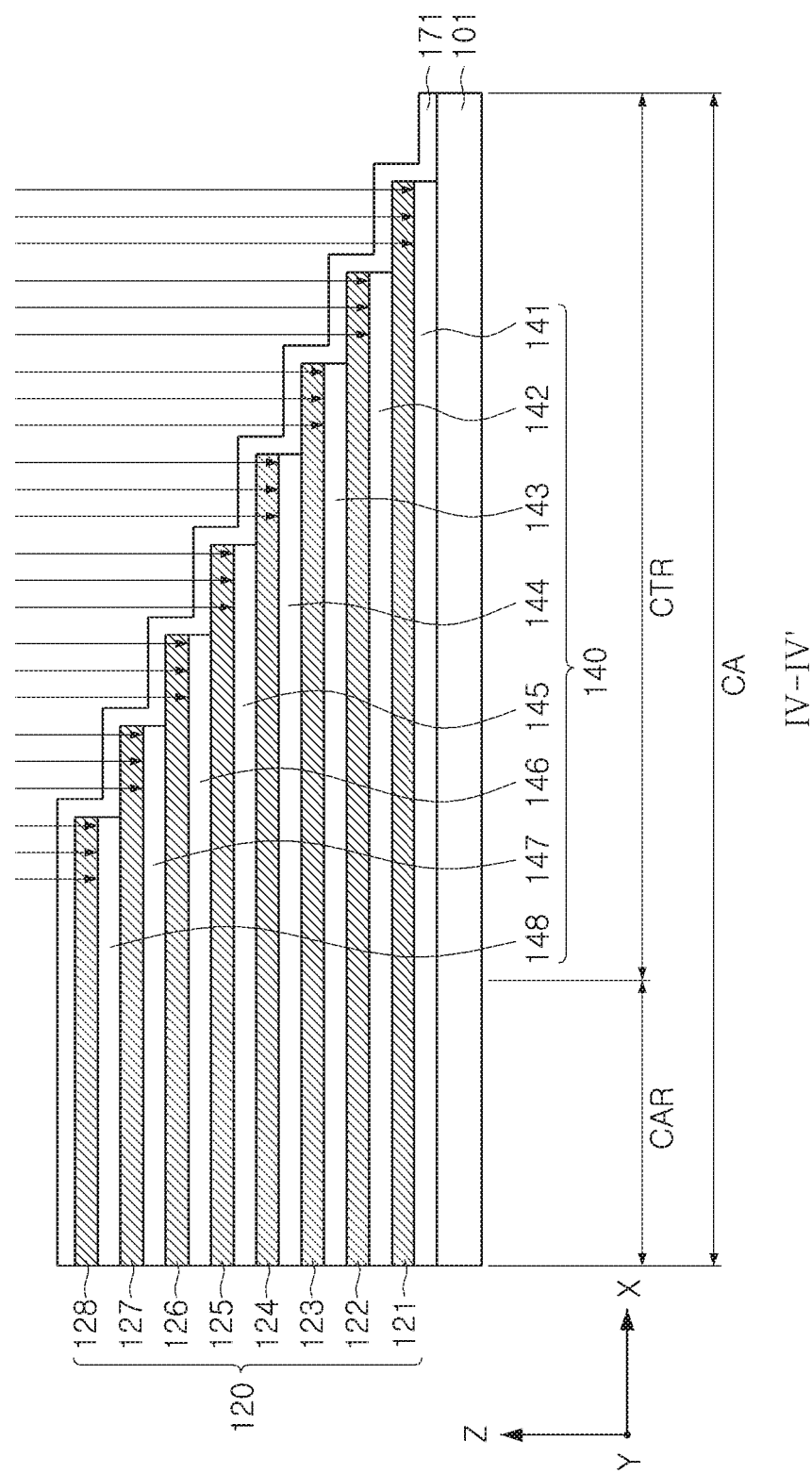
Figure 18:
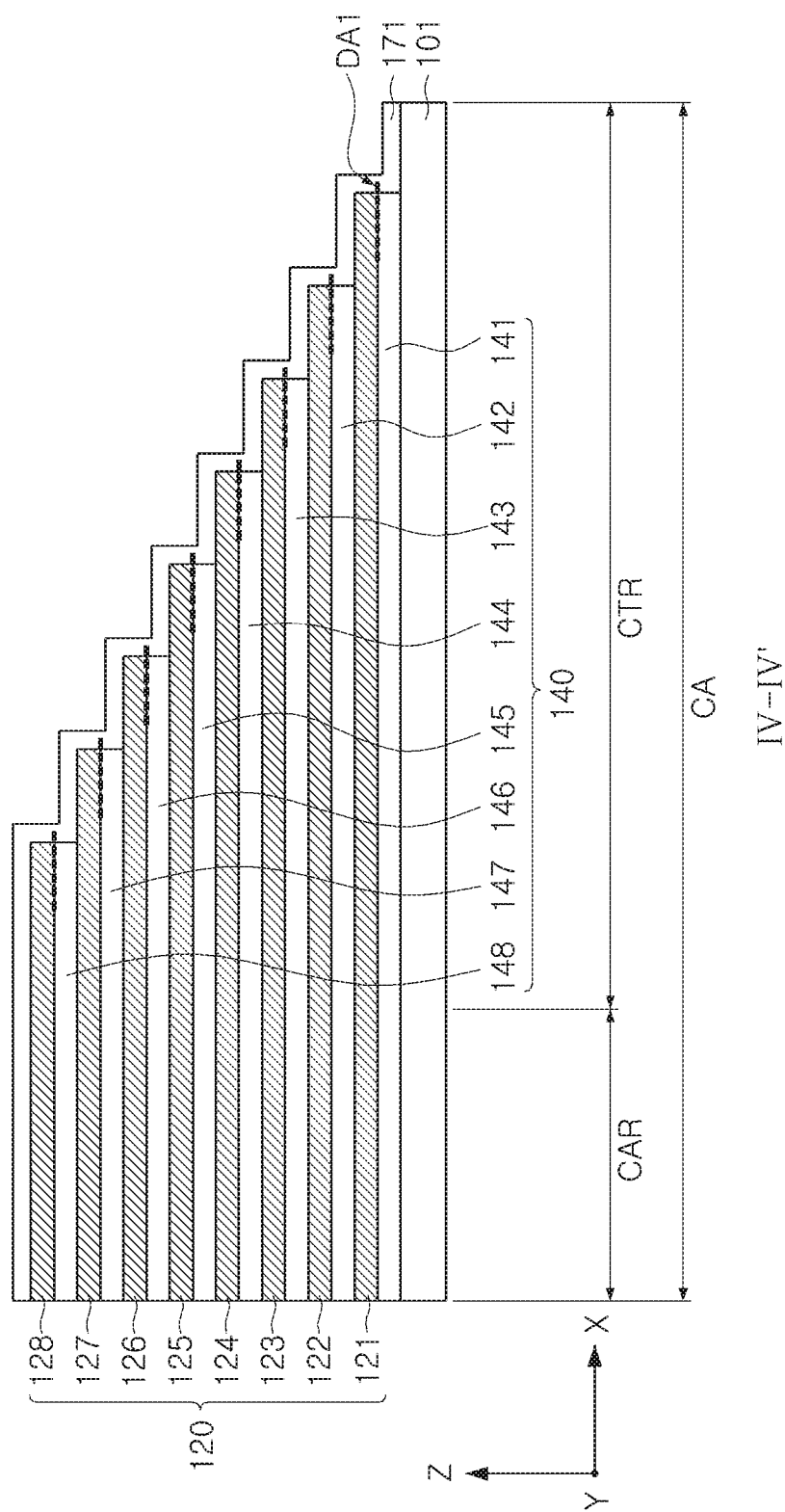

Next, referring to FIG. 17, an injection of an impurity may be performed in a first ion implantation (IIP) process. A target region into which an impurity is injected may be interfaces between the sacrificial layers 120 and the insulating layers 140 in respective pad regions, for example, lower surfaces of the sacrificial layers 120 in the pad regions. The impurity injected in the first ion implantation process may be phosphorus (P), arsenic (As), nitrogen (N), or the like. Referring to FIG. 18, a damage region DA1 may be formed in the vicinity of lower surfaces of the sacrificial layers 120 on respective pad regions, through the first ion implantation process. The damage regions DA1 disposed in the vicinity of lower surfaces of the sacrificial layers 120 may have a deteriorated film characteristics as compared with different regions, and thus, may have a relatively high etching rate.

Figure 19:
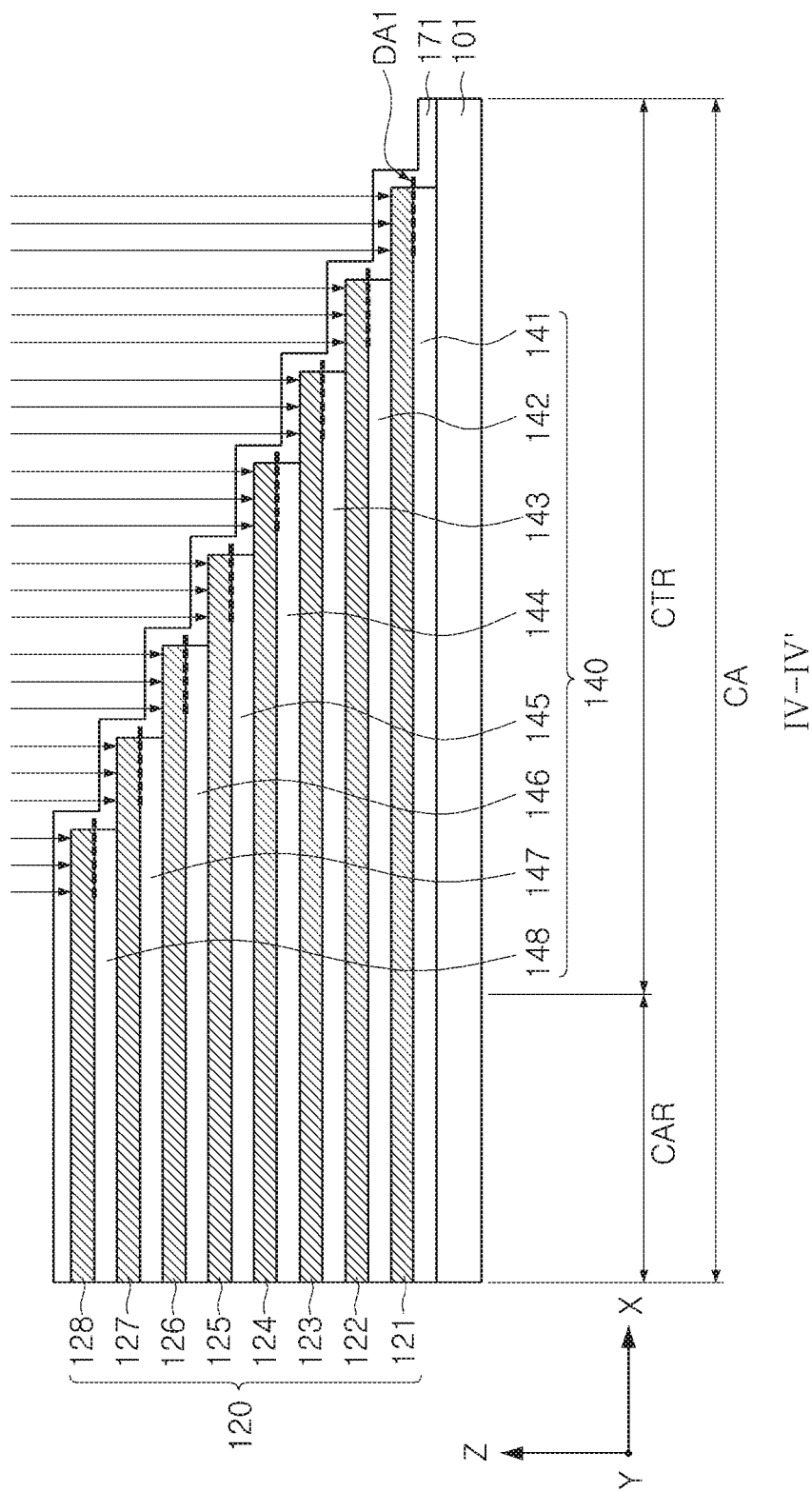
Figure 20:
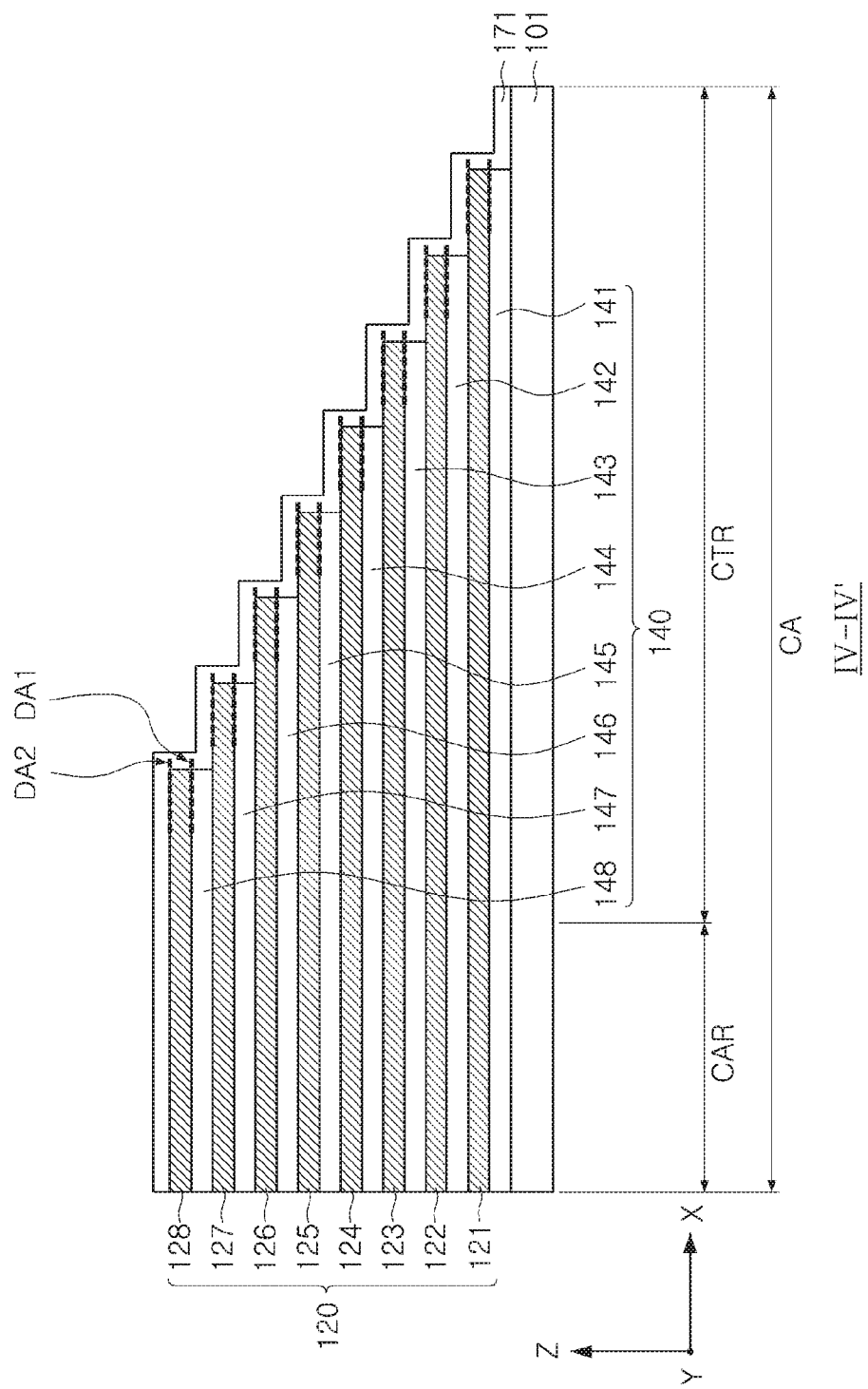

With reference to FIG. 19, an injection of an impurity may be performed in a second ion implantation process. A target region into which an impurity is injected in the second ion implantation process may be interfaces between the sacrificial layers 120 and the first interlayer insulating layer 171, for example, upper surfaces of the sacrificial layers 120 on the respective pad regions. An impurity type injected in the second ion implantation process may be similar to that used in the first ion implantation process. With reference to FIG. 20, damage regions DA2 may be disposed on upper surfaces of the sacrificial layers 120 on respective pad regions, through the second ion implantation process. As a result, the damage regions DA1 and DA2 may be disposed on upper and lower surfaces of the sacrificial layers 120 on the pad regions, respectively, through the first and second ion implantation processes. The damage regions DA and DA2 may have a relatively high etching rate as compared to different regions.

Figure 21:
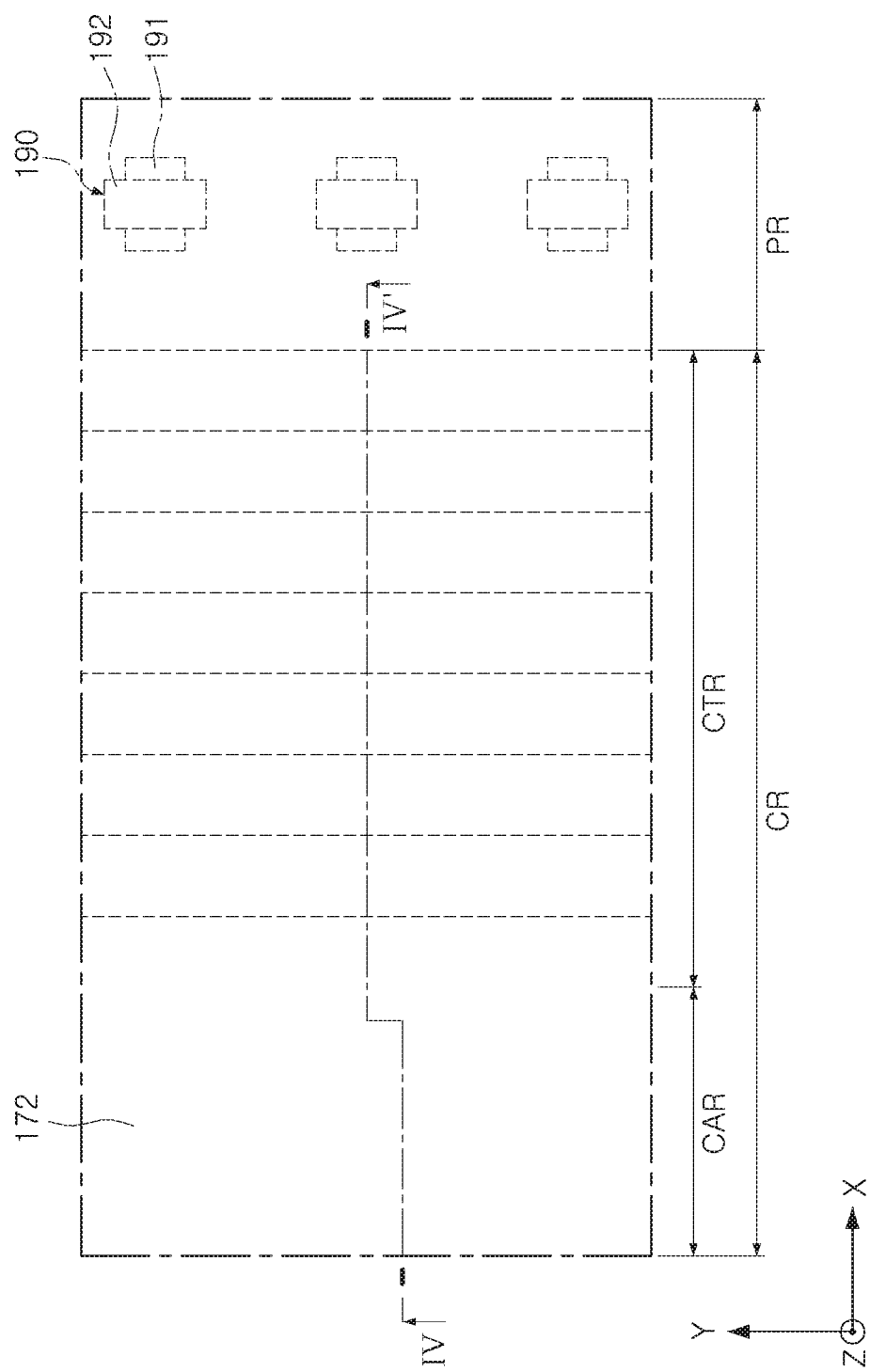
Figure 22:
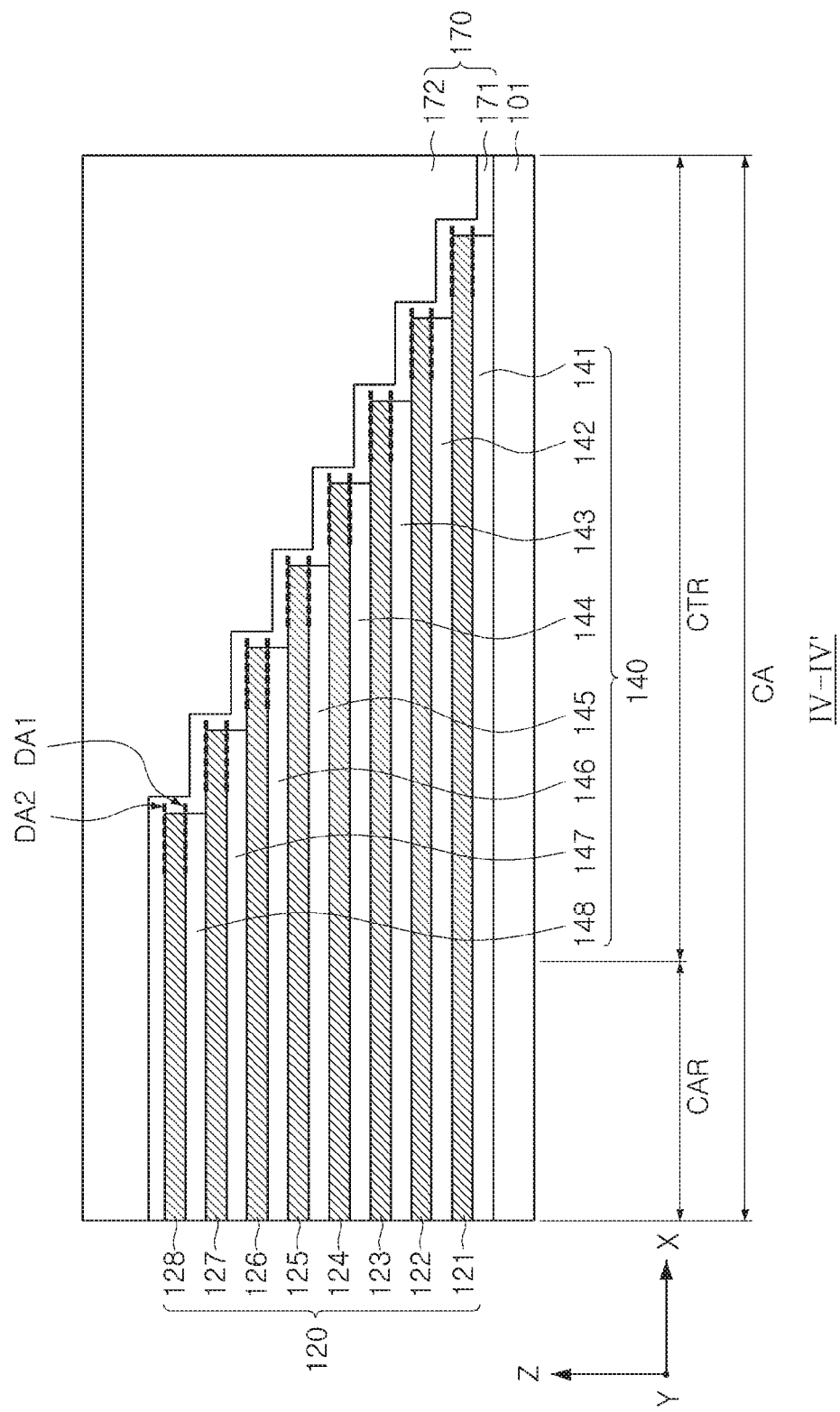

Next, referring to FIGS. 21 and 22, a second interlayer insulating layer 172 may be provided on the first interlayer insulating layers 171. The second interlayer insulating layer 172 may have a larger volume than that of the first interlayer insulating layer 171, and may be formed of a TEOS oxide film or the like having a fast deposition speed. A plurality of channel structures CH and DCH penetrating through the sacrificial layers 120 and the insulating layers 140 may be formed after the second interlayer insulating layer 172 is formed, referring to FIGS. 23 and 24. The plurality of channel structures CH and DCH may include cell channel structures CH and dummy channel structures DCH.

In a process of forming the plurality of channel structures CH and DCH, a plurality of channel holes may be formed in an initial operation. The channel hole may have a depth recessed into at least a portion of the substrate 101 while penetrating through the sacrificial layers 120 and the insulating layers 140. The channel hole may be filled with a gate insulating layer 160, a channel layer 110, and an embedded insulating layer 115, sequentially, and a bit line pad 113 and an epitaxial layer 111 may be disposed on upper and lower portions of the channel layer 110, respectively. The epitaxial layer 111 may be a layer formed by applying a selective epitaxial growth process to a portion of the substrate 101 exposed by the channel hole. A gate insulating layer 160 may include a tunneling layer, a charge storage layer, a blocking layer, and the like, sequentially disposed from the channel layer 110.

A plurality of layers included in the gate insulating layer 160 may be formed using a process such as atomic layer deposition (ALD), chemical vapor deposition (CVD), or the like, and the blocking layer, the charge storage layer, the tunneling layer may be sequentially stacked from a region adjacent to the sacrificial layers 120 and the insulating layers 140. The channel layer 110 may have a preset thickness, for example, a thickness within a range of 1/50 to 1/5 of a width of a channel opening portion, and may be formed by ALD or CVD in a manner similar to the gate insulating layer 160.

An internal space of the channel layer 110 may be filled with the embedded insulating layer 115. Selectively, before forming the embedded insulating layer 115, a hydrogen annealing process in which a structure having the channel layer 110 formed therein is subjected to a heat treatment in a gas atmosphere including hydrogen or heavy hydrogen may further be performed. The majority of crystalline defects present in the channel layer 110 may be eliminated by the hydrogen annealing process. Next, the bit line pad 113 may be formed using a conductive material such as polysilicon or the like, on the channel layer 110.

Figure 23:
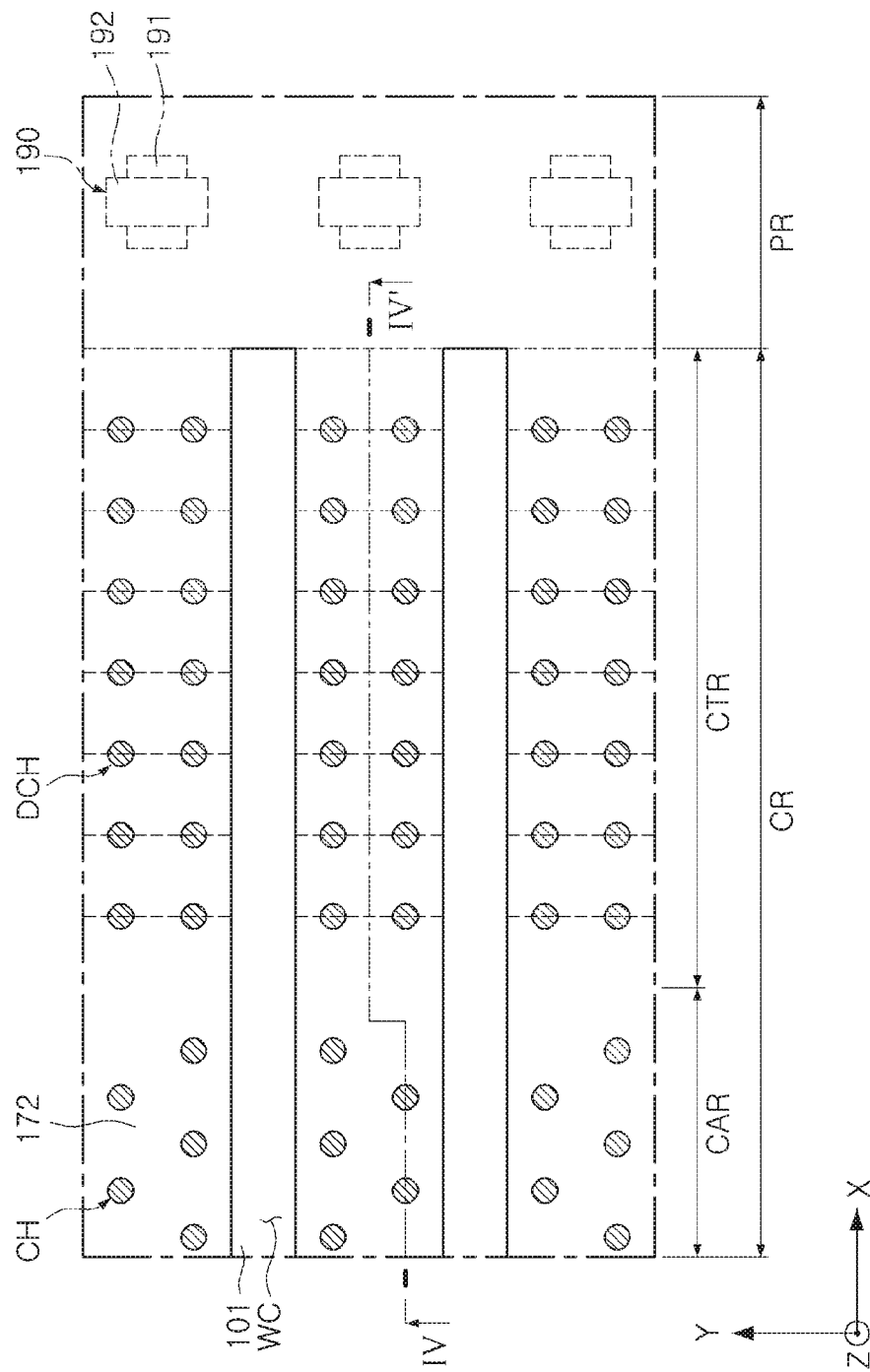
Figure 24:
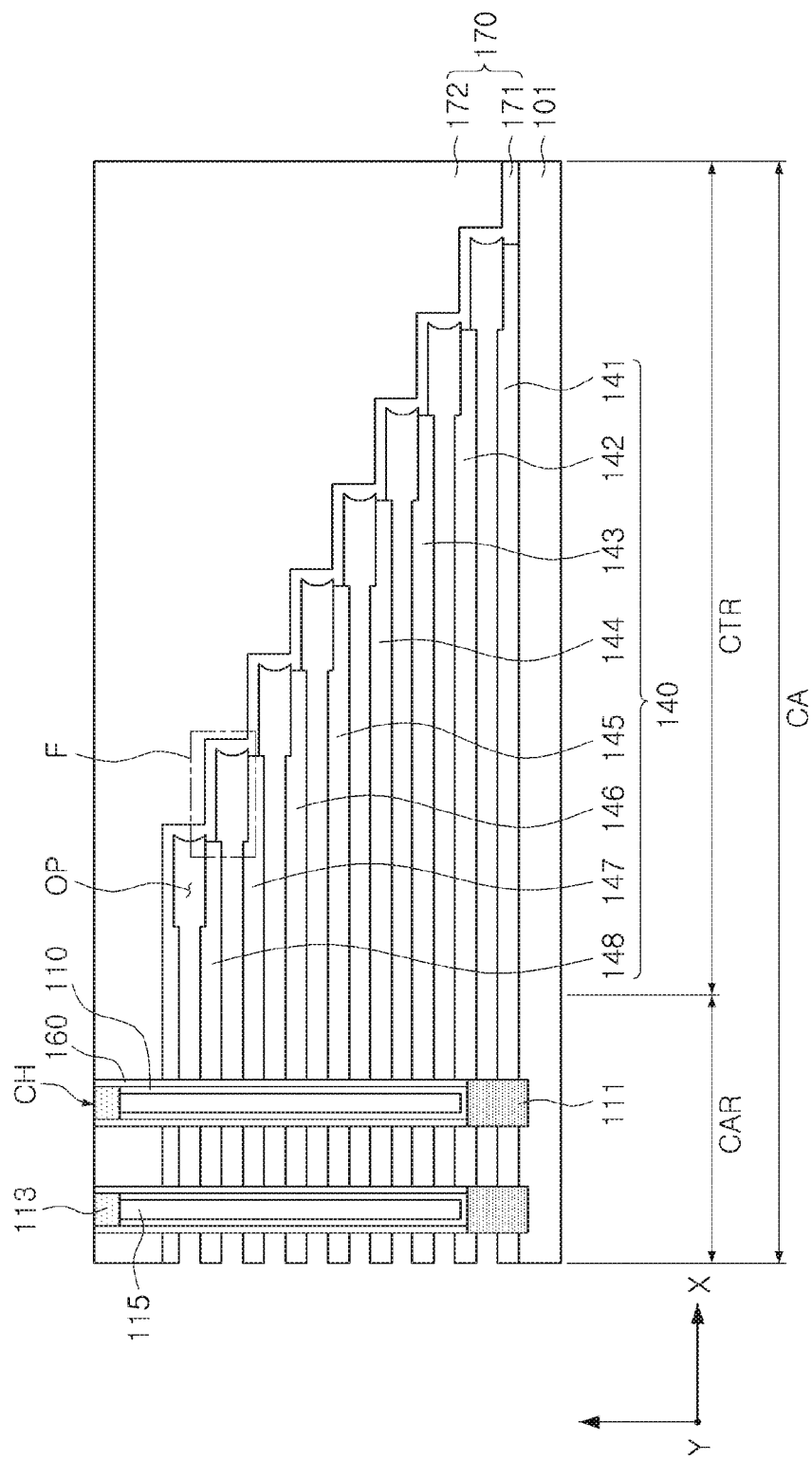

Also, with reference to FIGS. 23 and 24, a plurality of word line cuts WC may be formed. A portion of the substrate 101 may be exposed within the word line cut WC. The sacrificial layers 120 and the insulating layers 140 may be divided into a plurality of regions by the word line cuts WC on an X-Y plane. As an etching solution, for example, phosphoric acid (HP) or the like is introduced through the word line cut WC, and only the sacrificial layers 120 may be removed selectively, without removing the insulating layers 140. Referring to FIG. 24, only the sacrificial layers 120 may be removed, to provide a plurality of opening regions OP therein.

Referring to FIGS. 17 to 20, damage regions DA1 and DA2 including impurities may be disposed in the vicinity of upper and lower surfaces of the sacrificial layers 120 in the pad region, using the first and second ion implantation processes. Impurities included in the damage regions DA1 and DA2 may be diffused by heat applied thereto in a subsequent process. The damage regions DA1 and DA2 and surrounding areas have film characteristics with damage caused by the impurities, and thus, may be removed more rapidly when an etching solution such as phosphoric acid or the like is introduced thereto. Thus, as illustrated in FIG. 24, the opening regions OP may have a relatively greater height in the pad region. A description thereof will be provided below with reference to FIG. 25.

Figure 25:
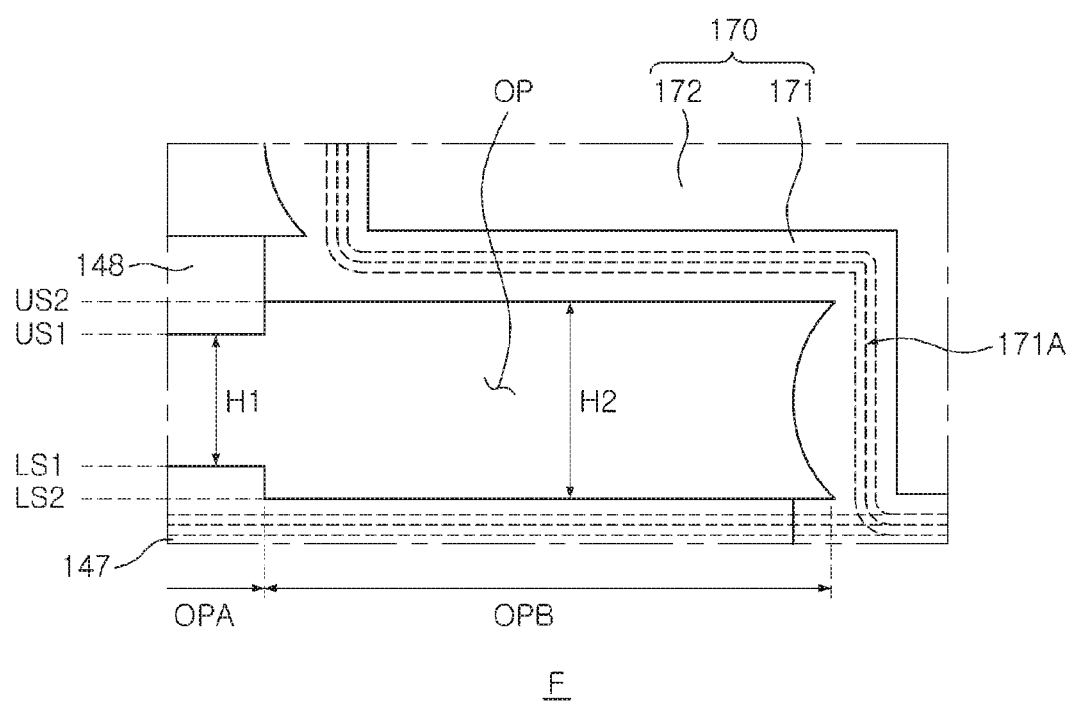

Referring to FIG. 25, each of the opening regions OP may have a first area OPA and a second area OPB. The first area OPA and the second area OPB may be a continuously-connected region, and the second region OPB may be provided in the pad region. Due to the damage regions DA1 and DA2, the sacrificial layers 120 are able to be removed more rapidly in the vicinity of upper and lower surfaces of the pad region. Thus, as illustrated in FIG. 25, a height H2 of the second area OPB may be higher than a height H1 of the first area OPA. In addition, as the sacrificial layers 120 may be removed more rapidly in the vicinity of upper and lower surfaces of the pad region, a lateral surface of the second area OPB may have a concave shape recessed inwardly. In an example embodiment, the first interlayer insulating layer 171 may include a doped region 171A in which a portion of the impurities diffused from the remaining damage regions DA1 and DA2 remains.

The memory device 300 according to the example embodiment illustrated in FIGS. 9 and 10, and the method of manufacturing the memory device 400 according to the example embodiment illustrated in FIGS. 11 and 12 may also be understood by referring the descriptions above with reference to FIGS. 17 to 25. In the case of the first and second ion implantation processes described above with FIGS. 17 to 20, in a case in which only the first ion implantation process is performed and the secondary ion implantation process is omitted, impurities may only be doped on an interface between the sacrificial layers 120 and the insulating layers 140. Thus, the memory device 400 according to the example embodiment illustrated in FIGS. 11 and 12 may be manufactured by only performing the first ion implantation process, without the second ion implantation process.

Meanwhile, in a case in which only the second ion implantation process is performed and the first ion implantation process is omitted, only an interface between the sacrificial layers 120 and the first interlayer insulating layer 171 may be doped with impurities. Thus, the memory device 300 according to the example embodiment illustrated in FIGS. 9 and 10 may be manufactured by only performing the second ion implantation process, without the first ion implantation process.

Figure 26:
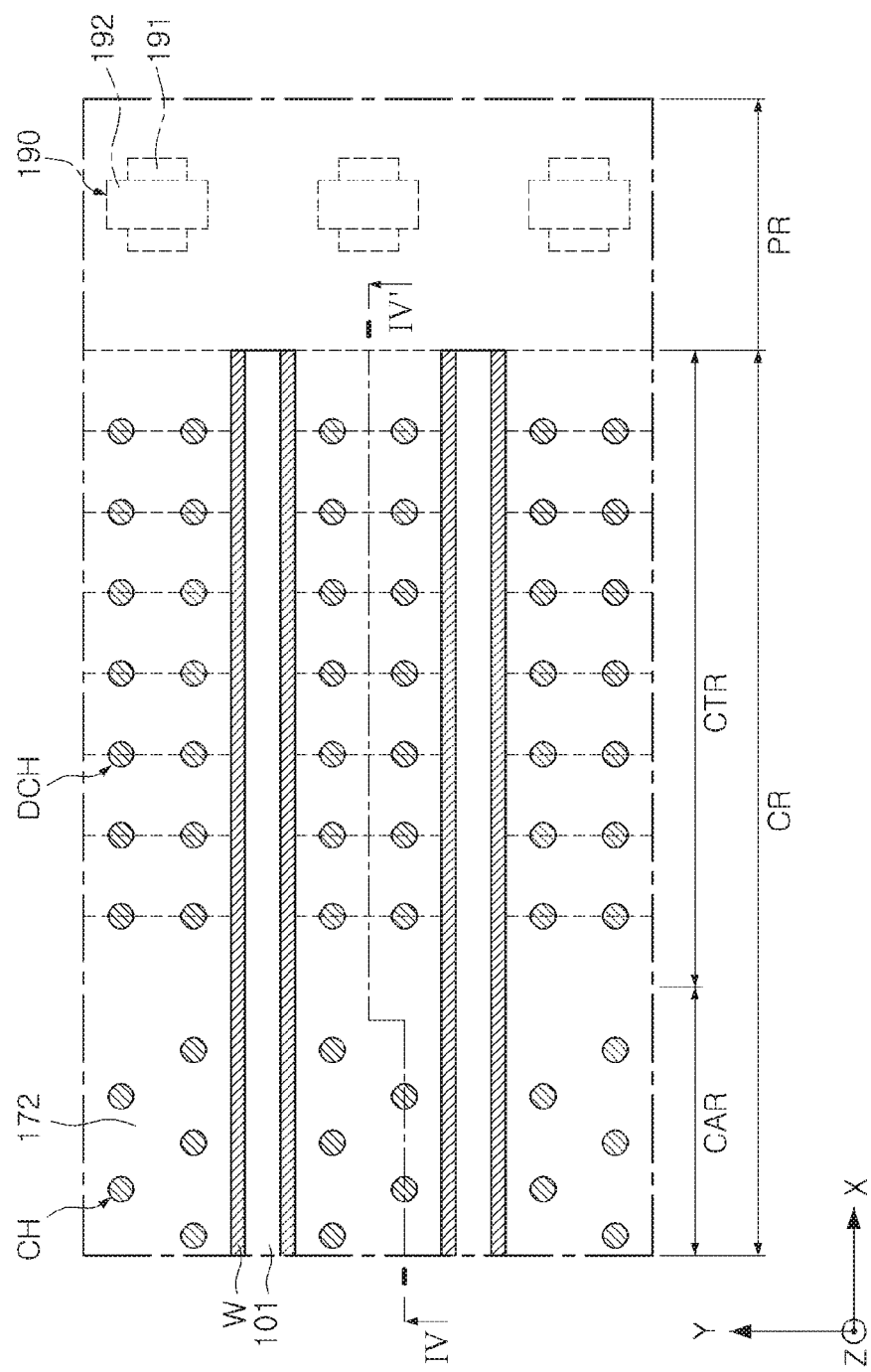
Figure 27:
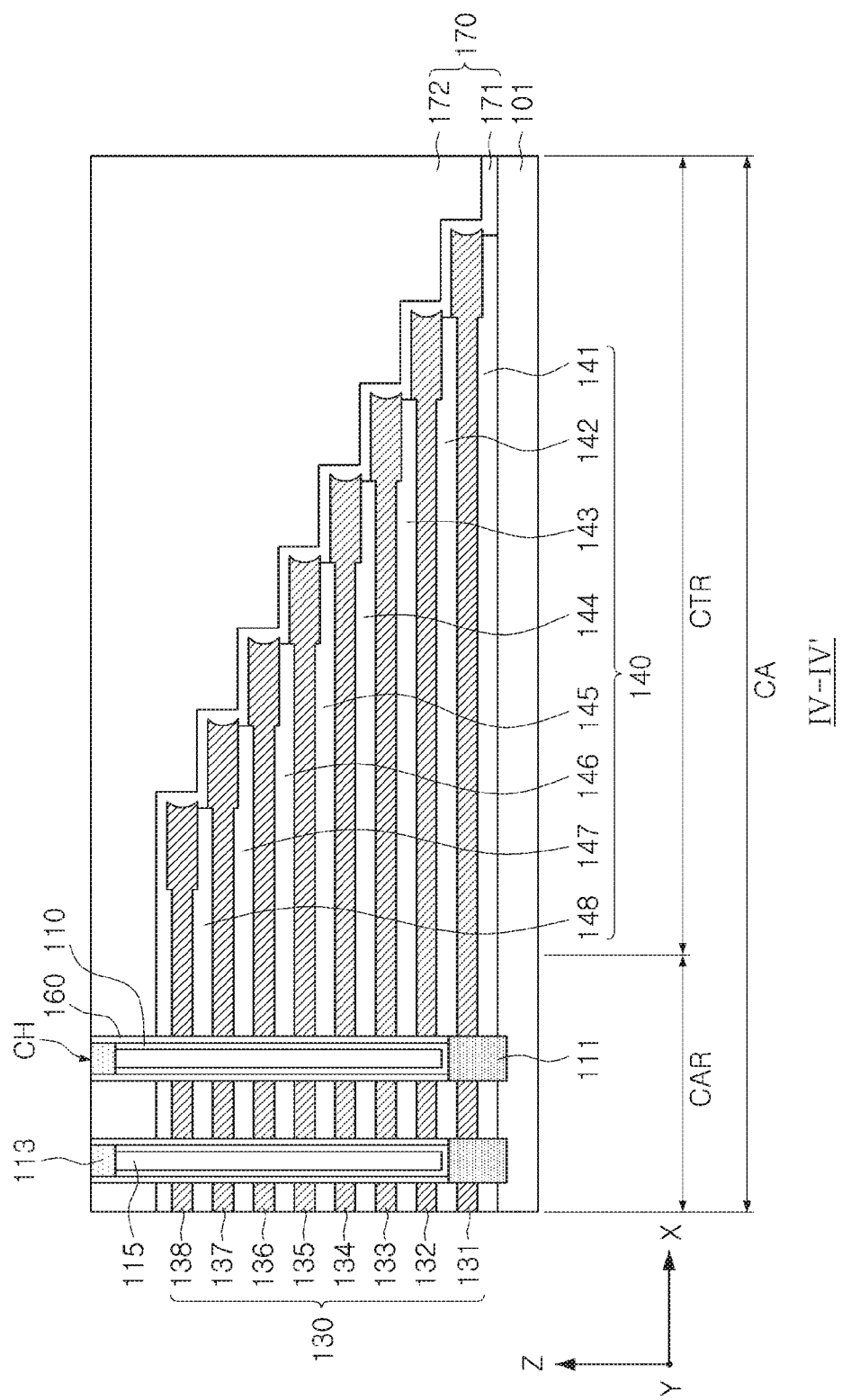

Next, referring to FIGS. 26 and 27, a plurality of opening regions OP may be filled with a conductive material through the word line cuts WC to thus form a plurality of gate electrode layers 131 to 138 (gate electrode layers 130). The gate electrode layers 130 may be formed of a metal, polysilicon, a metal silicide material, or the like. The metal silicide material may be a silicide material of a metal selected from, for example, cobalt (Co), nickel (Ni), hafnium (Hf), platinum (Pt), tungsten (W) and titanium (Ti), or a combination thereof. For example, when the gate electrode layers 130 are formed of a metal silicide material, a silicidizing process may be performed by forming a separate metal layer after embedding silicon (Si) in a side of the opening portions, thereby forming the gate electrode layers 130. In an example embodiment, the gate electrode layers 130 may also include a plurality of metal layers, and at least one of the plurality of metal layers may be a work function metal layer.

Figure 28:
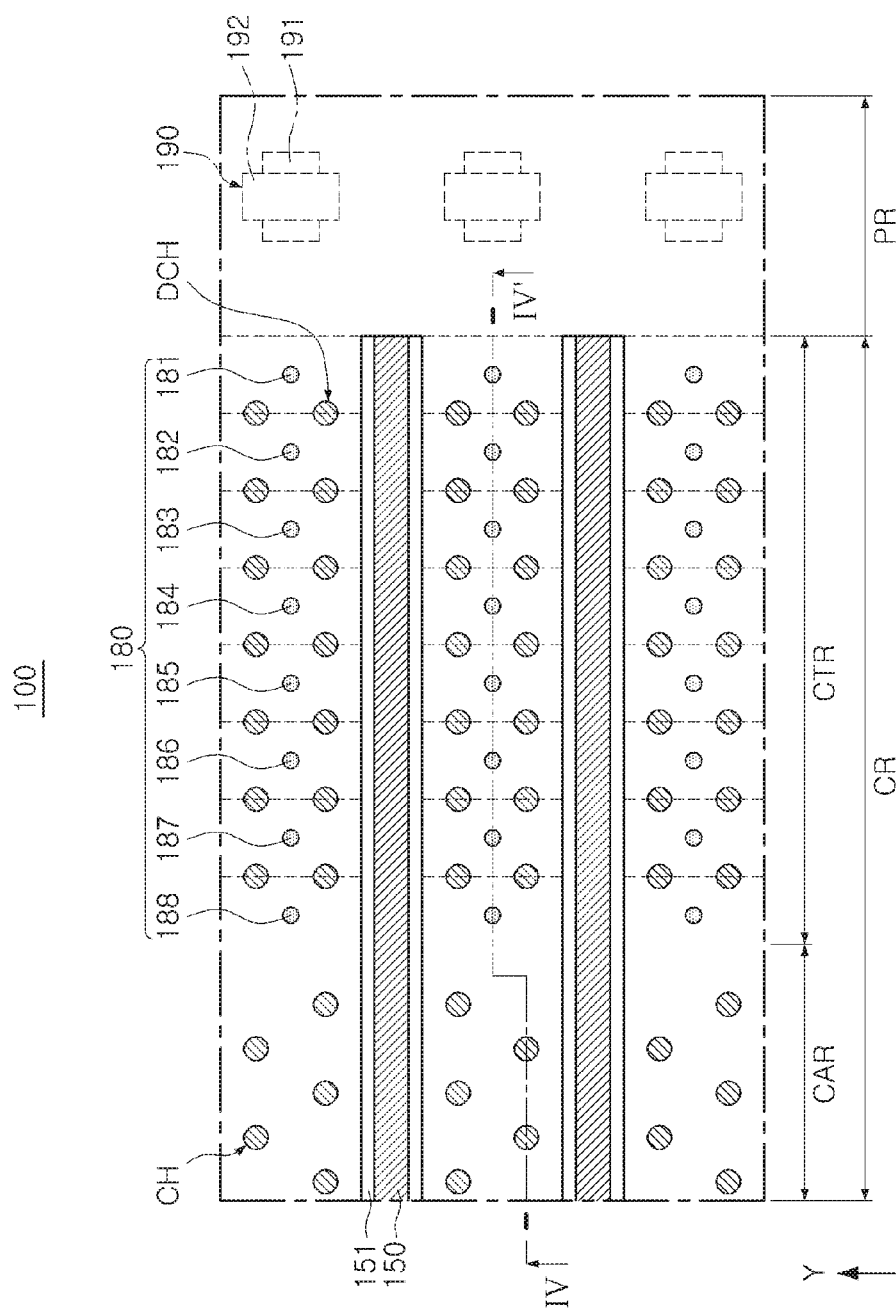
Figure 29:
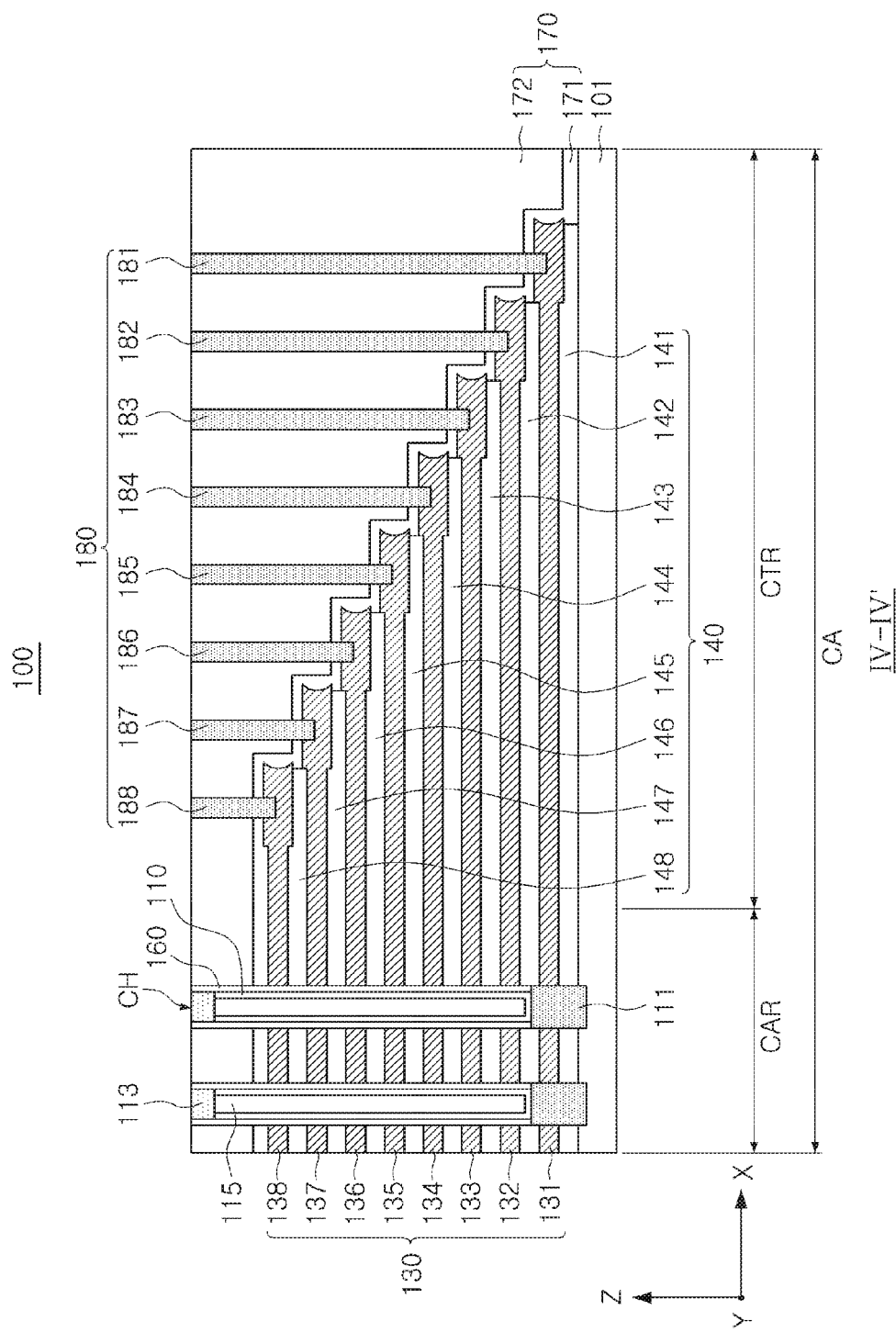

Referring to FIGS. 28 and 29, a plurality of contacts 181 to 188 (contacts 180) may be formed. The plurality of contacts 180 may be formed by forming a plurality of contact holes penetrating through the interlayer insulating layer 170, on the pad region, and by filling the contact holes with a conductive material such as a metal or the like. The contact holes may have a depth recessed into at least portions of the gate electrode layers 130.

In the example embodiment, the gate electrode layers 130 may have a relatively great thickness in the pad region. Thus, in the process of forming the contact holes, the gate electrode layers 130 may provide a relatively great margin in the pad region, and a problem in which a portion of the contact holes penetrates through the gate electrode layers 130 may be solved. As a result, as a short defect in which a portion of the contacts 180 is connected to two or more gate electrode layers 130 may be reduced, the reliability of the memory device 100 may be improved. In addition, since the gate electrode layers 130 having a relatively reduced thickness may be stacked in a relatively increased amount in a stack direction, the degree of integration of the memory device 100 may be increased.

A method of manufacturing a memory device according to an example embodiment will be described with reference to FIGS. 30 to 39. The method of manufacturing a memory device described with reference to FIGS. 30 to 39 may be applied to the method of manufacturing the memory device 200 described above with reference to FIGS. 7 and 8 according to the example embodiment.

Figure 30:
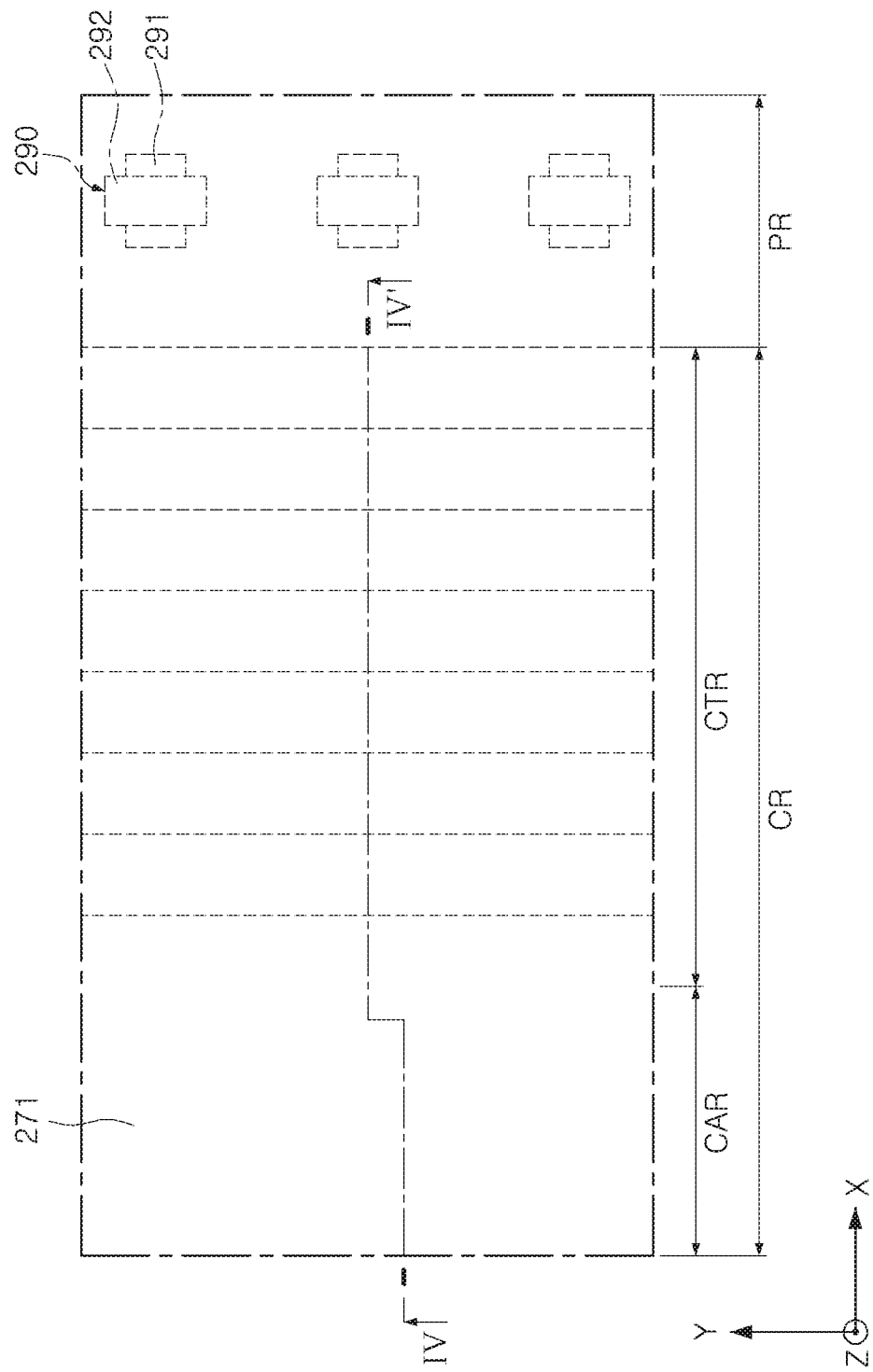
Figure 31:
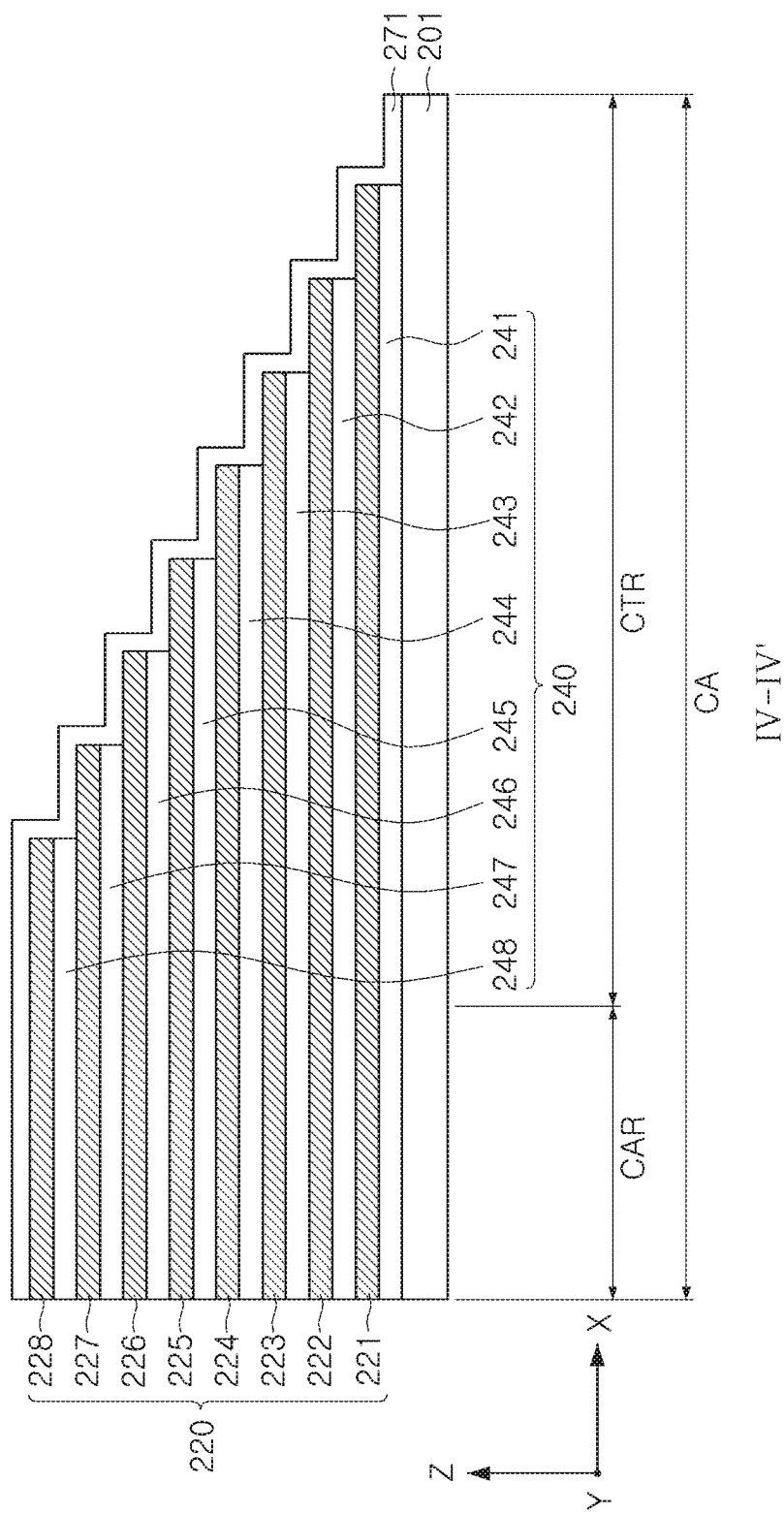

First, referring to FIGS. 30 and 31, a plurality of sacrificial layers 221 to 228 (sacrificial layers 220) and a plurality of insulating layers 241 to 248 (insulating layers 240) may be alternately stacked on a substrate 201. The sacrificial layers 220 and the insulating layers 240 may extend in a first direction (X-axis direction), while forming a pair with each other, to thus provide a plurality of pad regions having a step structure. The sacrificial layers 220 and the insulating layers 240 may be disposed in a cell region CR, and peripheral circuit devices 290 may be disposed in a peripheral circuit region PR in the vicinity of the cell region CR. A first interlayer insulating layer 271 including silicon oxide or the like may be formed on the sacrificial layers 220, the insulating layers 240, and the peripheral circuit devices 290.

Figure 32:
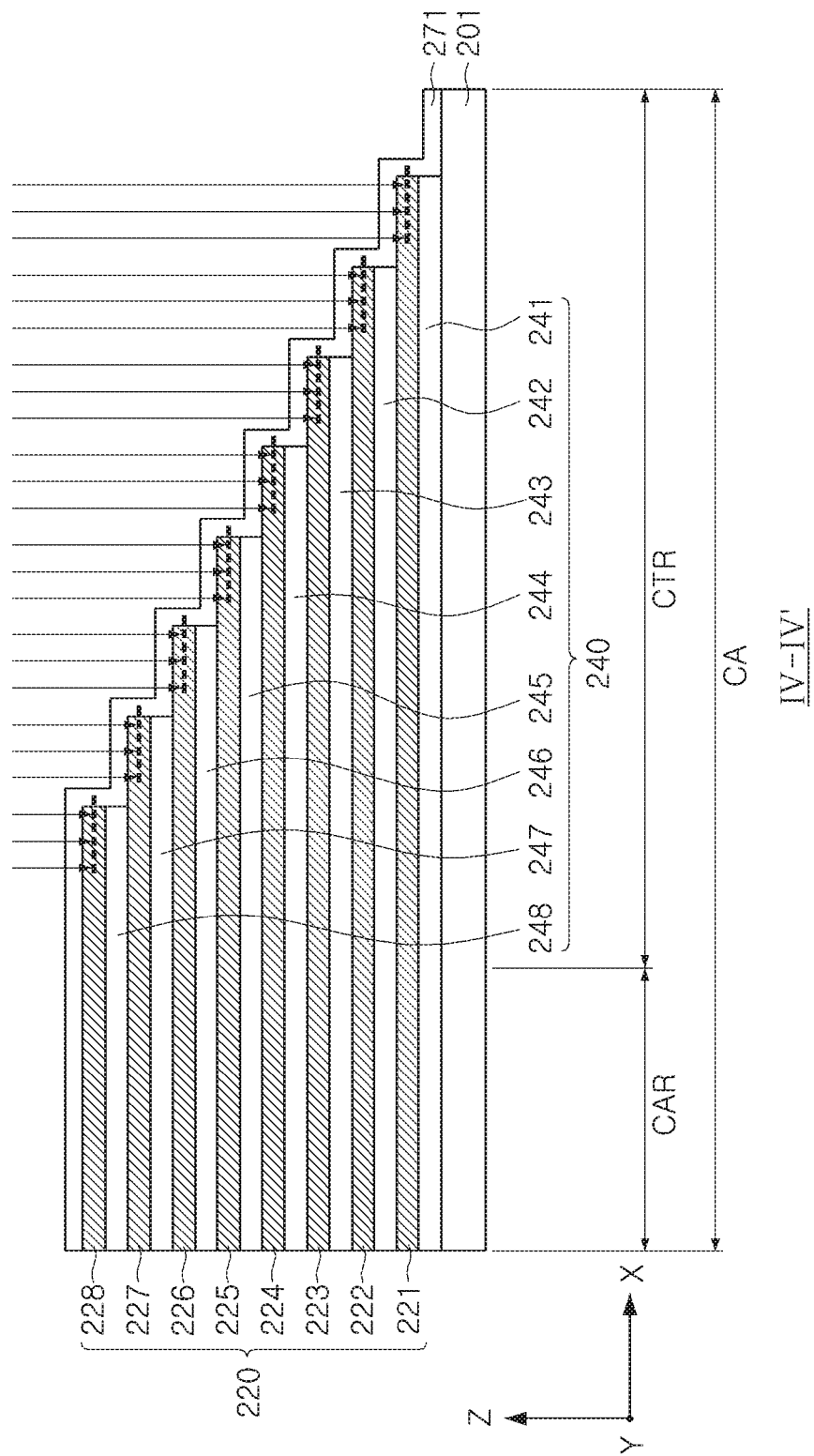
Figure 33:
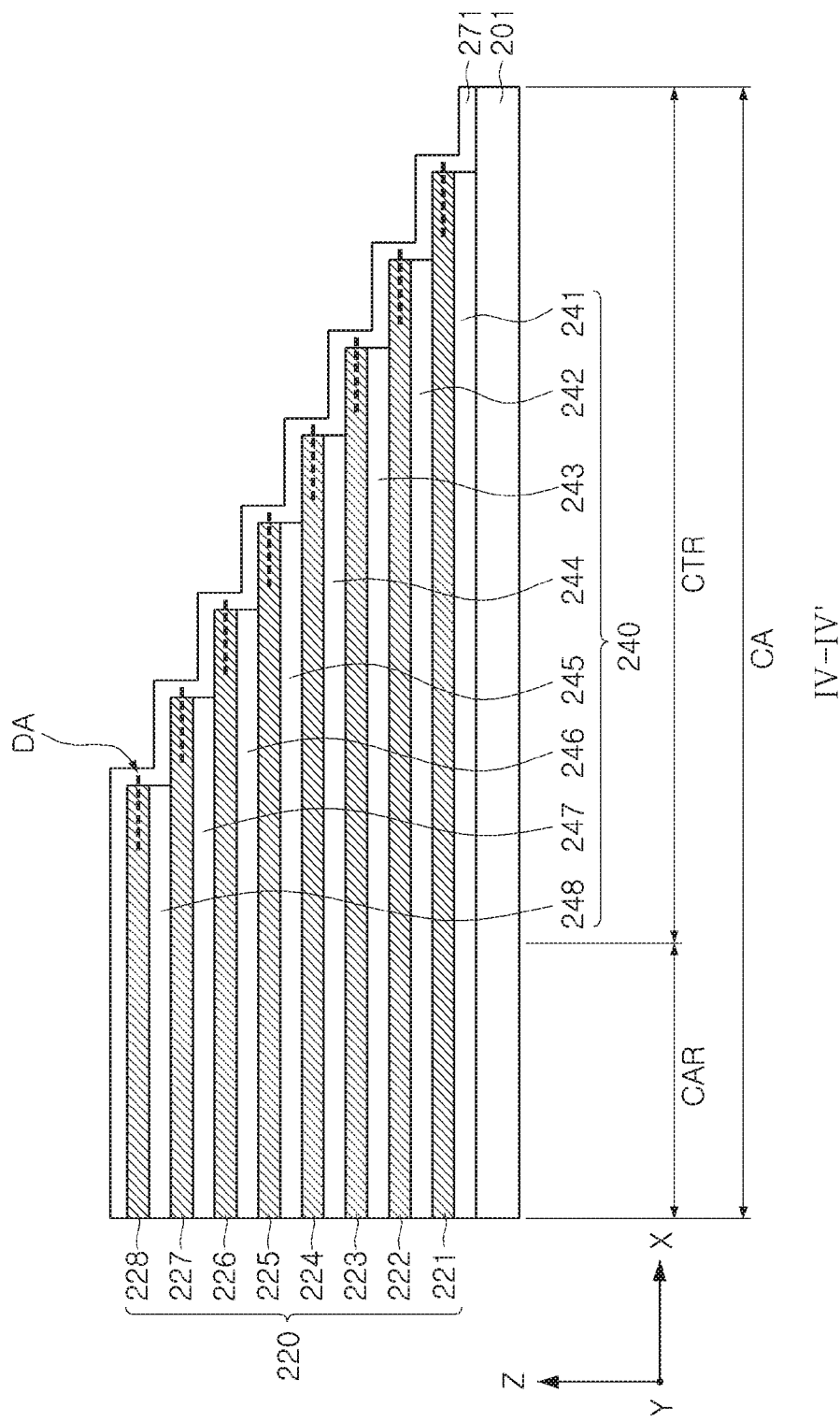

Referring to FIG. 32, an ion implantation process with respect to the sacrificial layers 220 may be performed. The impurity used in the ion implantation process may include phosphorus (P), arsenic (As), nitrogen (N), or the like. A target region into which an impurity is injected may be interfaces between the sacrificial layers 220 in respective pad regions. Film characteristics in a portion of the sacrificial layers 220 may be degraded due to the injected impurities, and a damage region DA1 having degraded film characteristics may be formed inside the sacrificial layers 220 in the respective pad regions as illustrated in FIG. 33.

Figure 34:
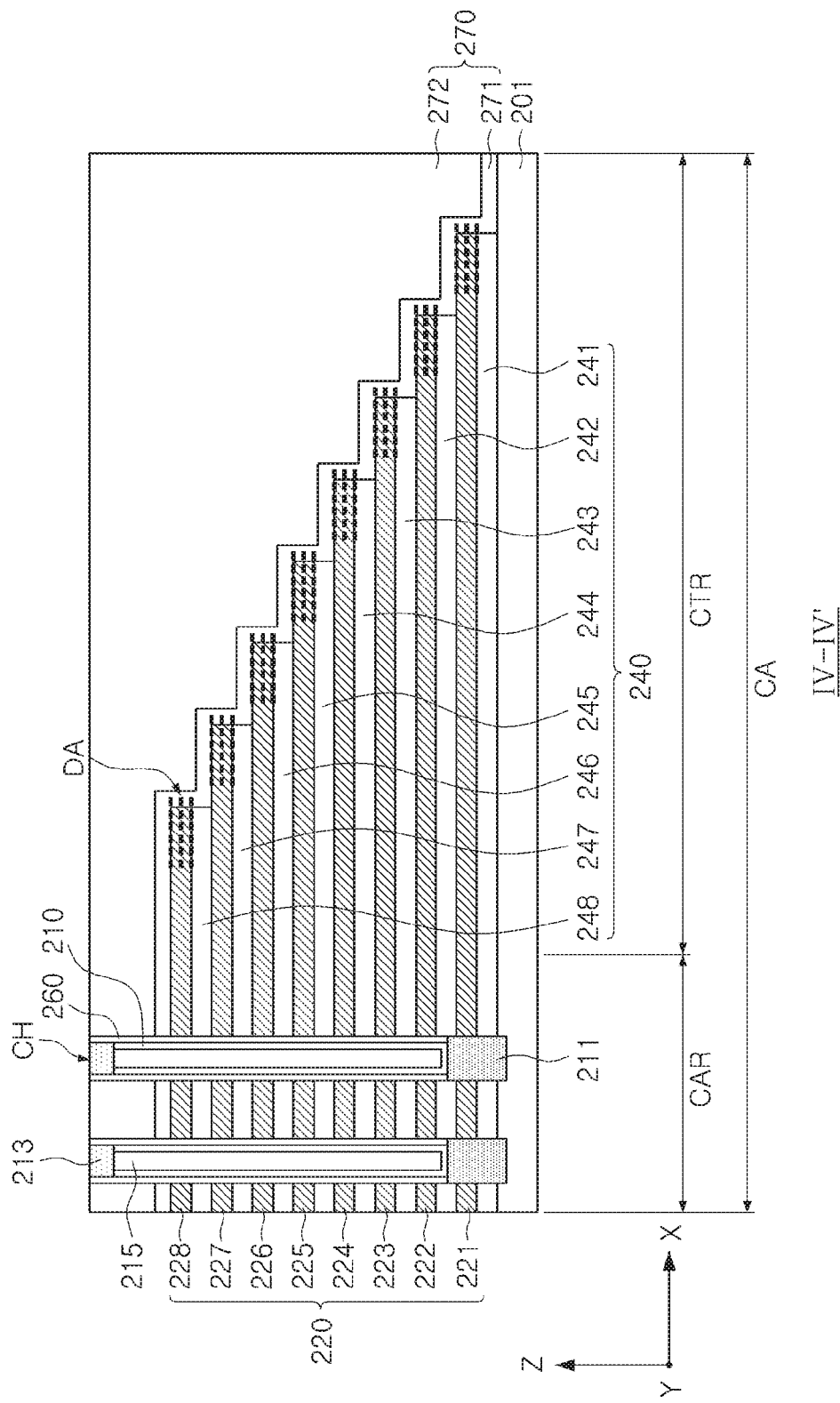

Referring to FIG. 34, a second interlayer insulating layer 272 may be formed on the first interlayer insulating layer 271, and a plurality of cell channel structures CH may be formed. Although not illustrated in FIG. 34, a dummy channel structure DCH may be formed together with the formation of the plurality of cell channel structures CH. The second interlayer insulating layer 272 may have a relatively large volume compared with the first interlayer insulating layer 271, and thus, may be configured of a TEOS oxide film or the like having a relatively high deposition rate. The impurities present in the damage regions DA may be diffused due to heat generated in the process of forming the second interlayer insulating layer 272. Thus, a region in which film characteristics are deteriorated may be increased in the sacrificial layers 220 as illustrated in FIG. 34, and the damage regions DA may be increased in the volume thereof.

Each of the plurality of cell channel structures CH may include a channel layer 210, an embedded insulating layer 215, an epitaxial layer 211, a bit line pad 213, a gate insulating layer 260, and the like. The gate insulating layer 260 may be disposed between the channel layer 210 and the sacrificial layers 220, and may include a blocking layer, a charge storage layer, a tunneling layer, and the like.

Figure 35:
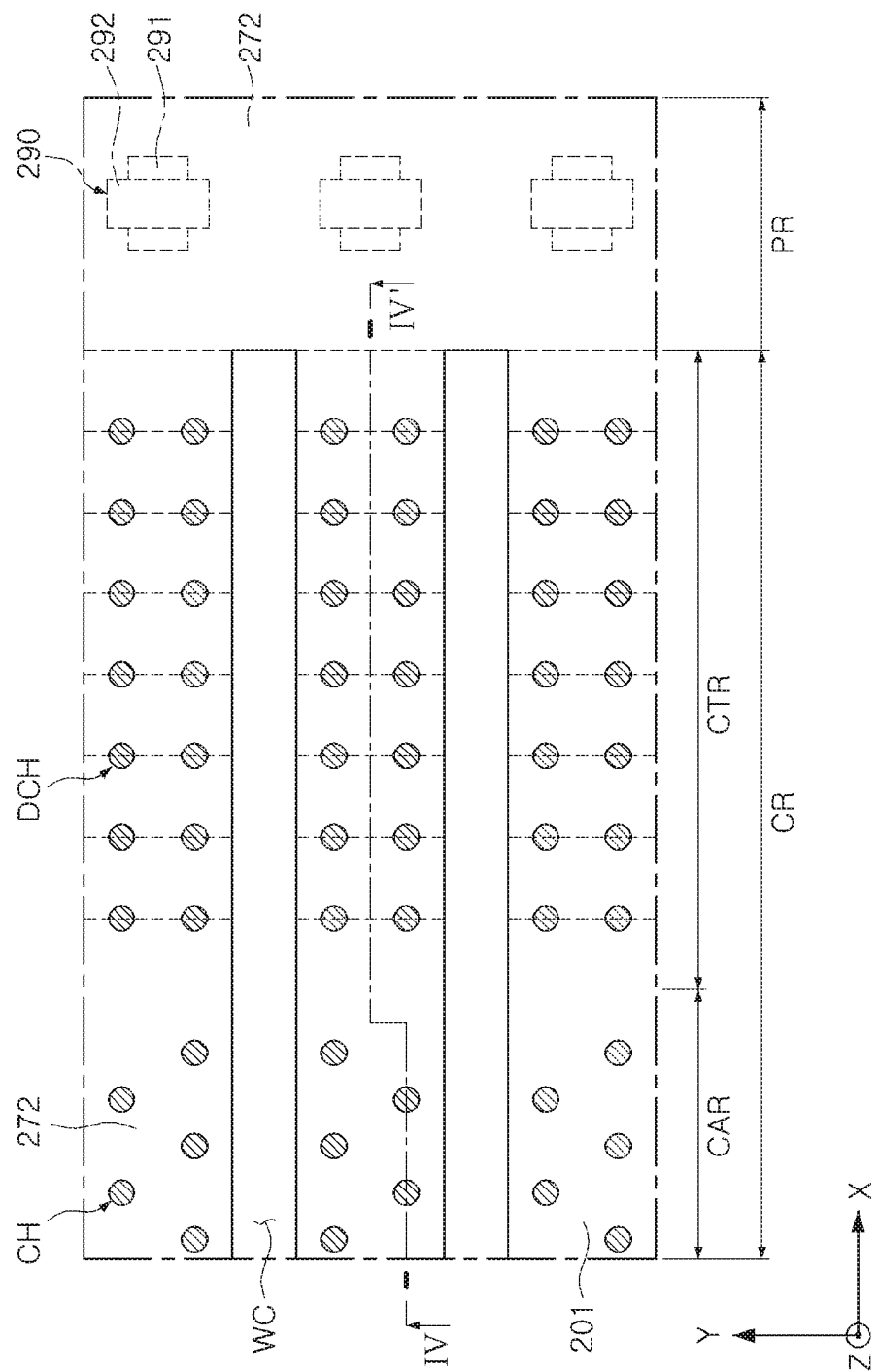
Figure 36:
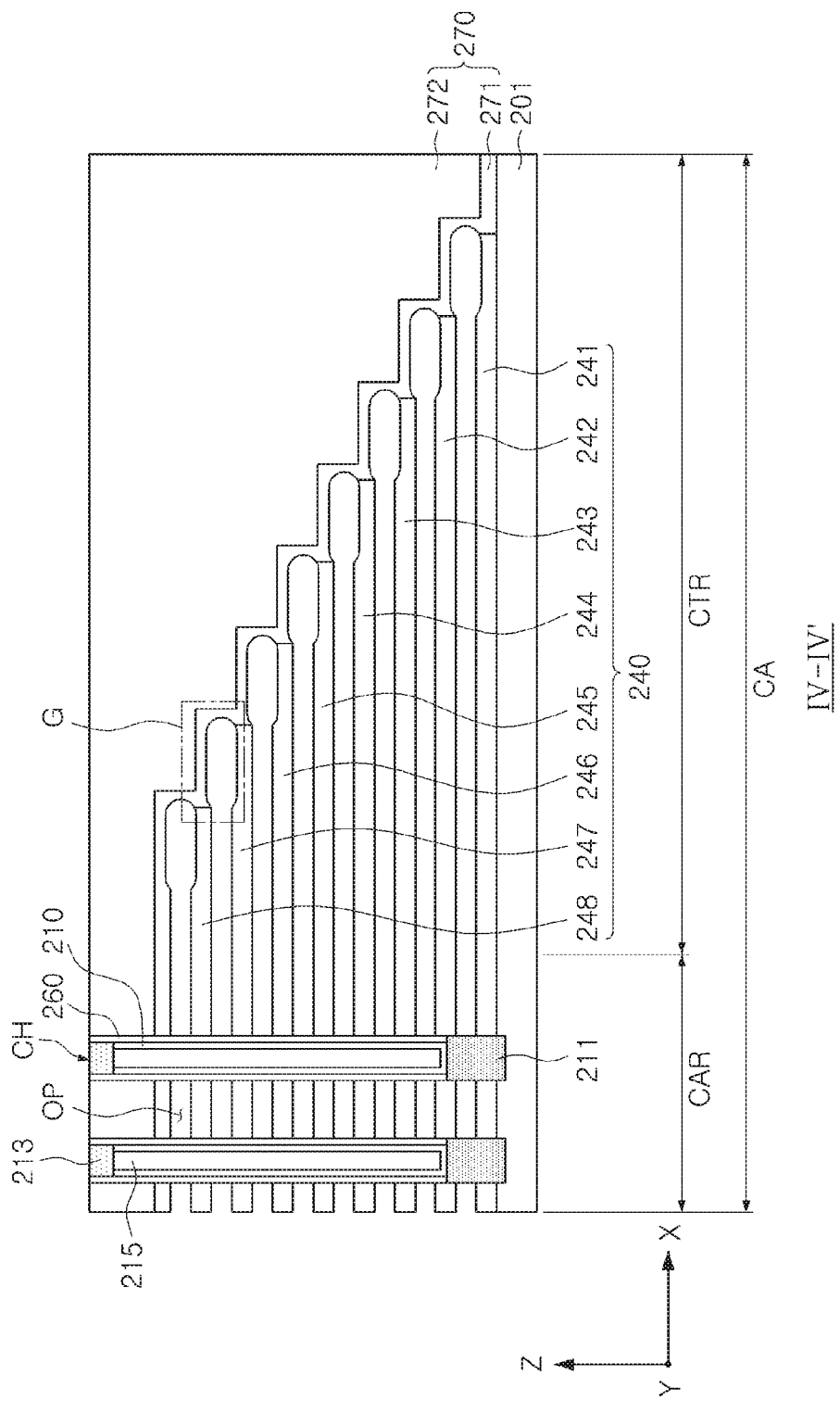

Subsequently, with reference to FIGS. 35 and 36, a plurality of word line cuts WC dividing the sacrificial layers 220 and the insulating layers 240 into a plurality of regions may be formed. The substrate 201, the sacrificial layers 220, and insulating layers 240 may be exposed within the word line cuts WC. With reference to FIG. 36, as an etching solution, for example, phosphoric acid (HP) or the like, is introduced to an inside of the word line cuts WC, only the sacrificial layers 120 may be selectively removed while allowing the insulating layers 140 to remain. A plurality of opening regions OP may be formed by removing the sacrificial layers 120.

For example, when removing the sacrifice layers 220, damage regions (DA) in which impurities having been injected in the ion implantation process are present may have a relatively rapid etching rate due to the deteriorated film characteristics. Thus, opening regions OP may have a relatively increased height in the respective pad regions into which the impurities have been injected. Hereinafter, a description thereof will be provided below with reference to FIG. 37.

Figure 37:
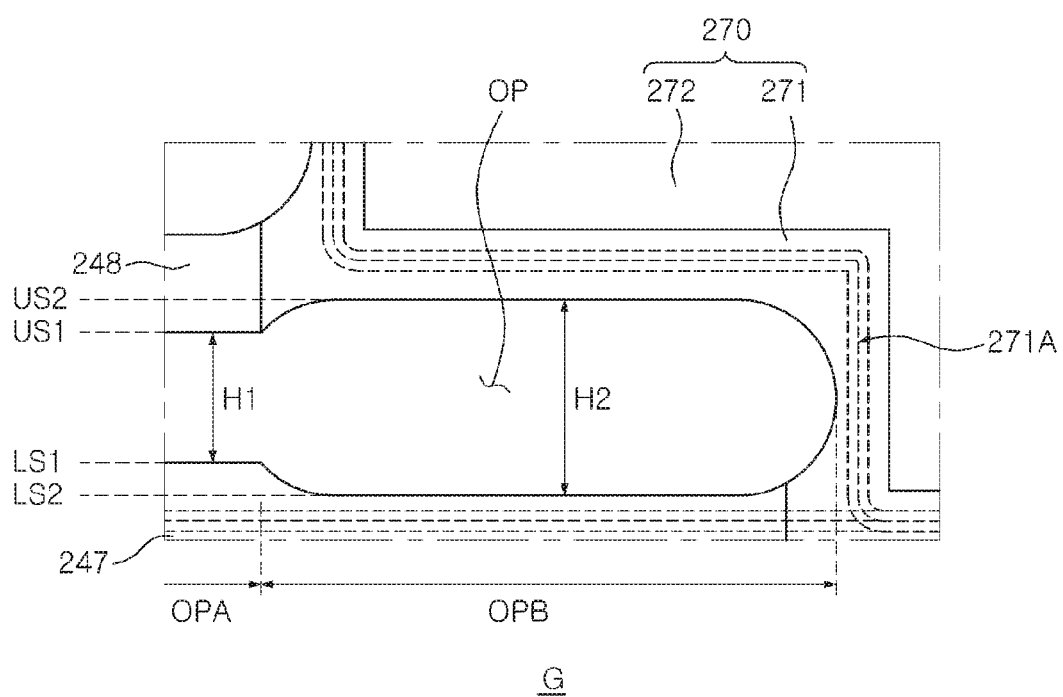

FIG. 37 is an enlarged view of region G of FIG. 36. Referring to FIG. 37, each of the opening regions OP may have a first area OPA and a second area OPB. The first area OPA and the second area OPB may be provided as a single connected region, and the second region OPB may be provided in the pad region and may be defined as a region having a height greater than the first area OPA. As illustrated in FIG. 37, an upper surface US2 and a lower surface LS2 of the second area OPB may be disposed to be higher and lower than an upper surface US1 and a lower surface LS1 of the first area OPA, respectively.

Meanwhile, the first interlayer insulating layer 271 may include a doped region 271A including impurities. The doped region 271A may be a region in which the impurity having been injected into the sacrificial layers 220 is diffused to the inside of the first interlayer insulating layer 271 and then remains. The doped region 271A may be distributed along an interface surface between the first interlayer insulating layer 271 and the second interlayer insulating layer 272.

Figure 38:
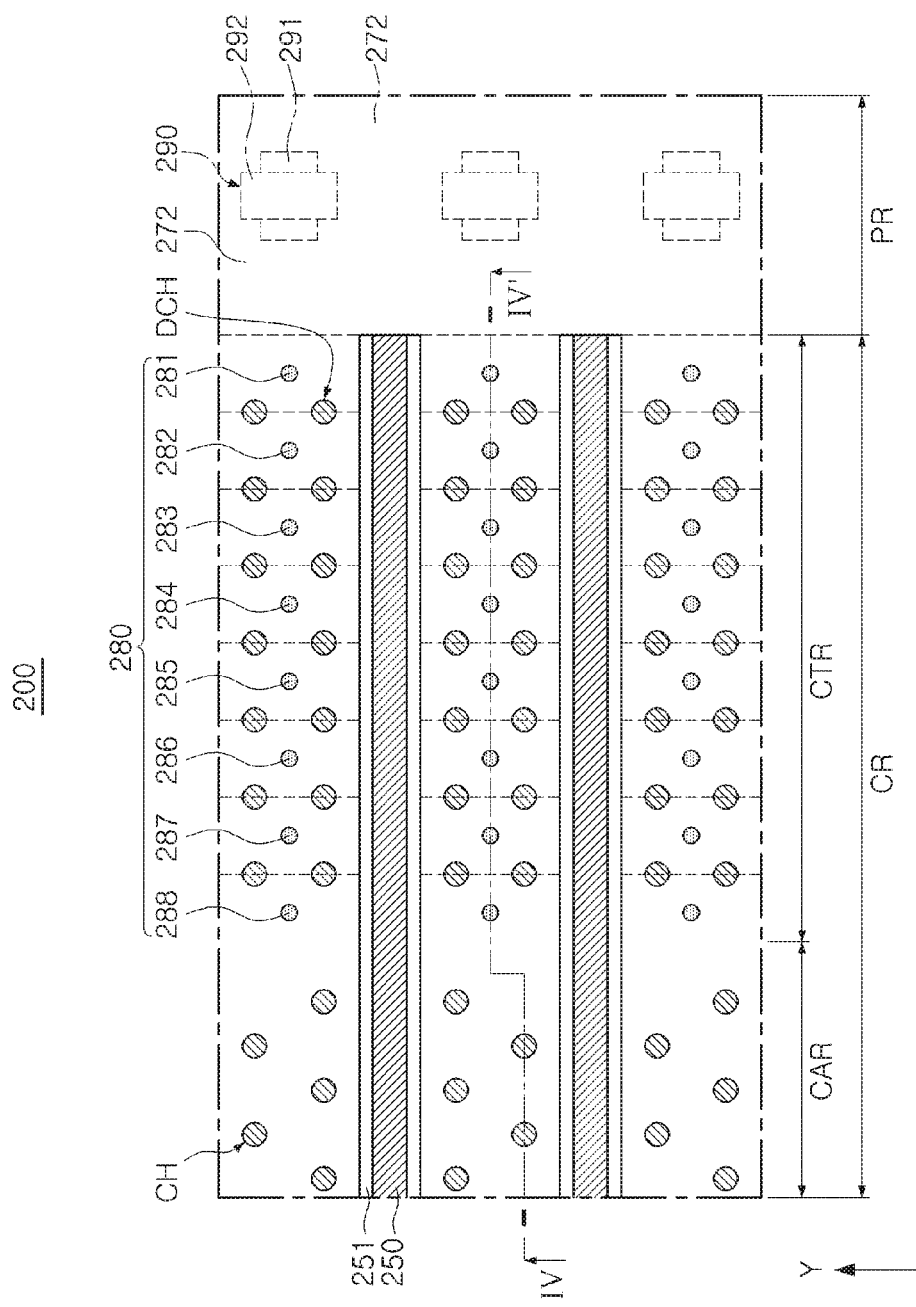
Figure 39:
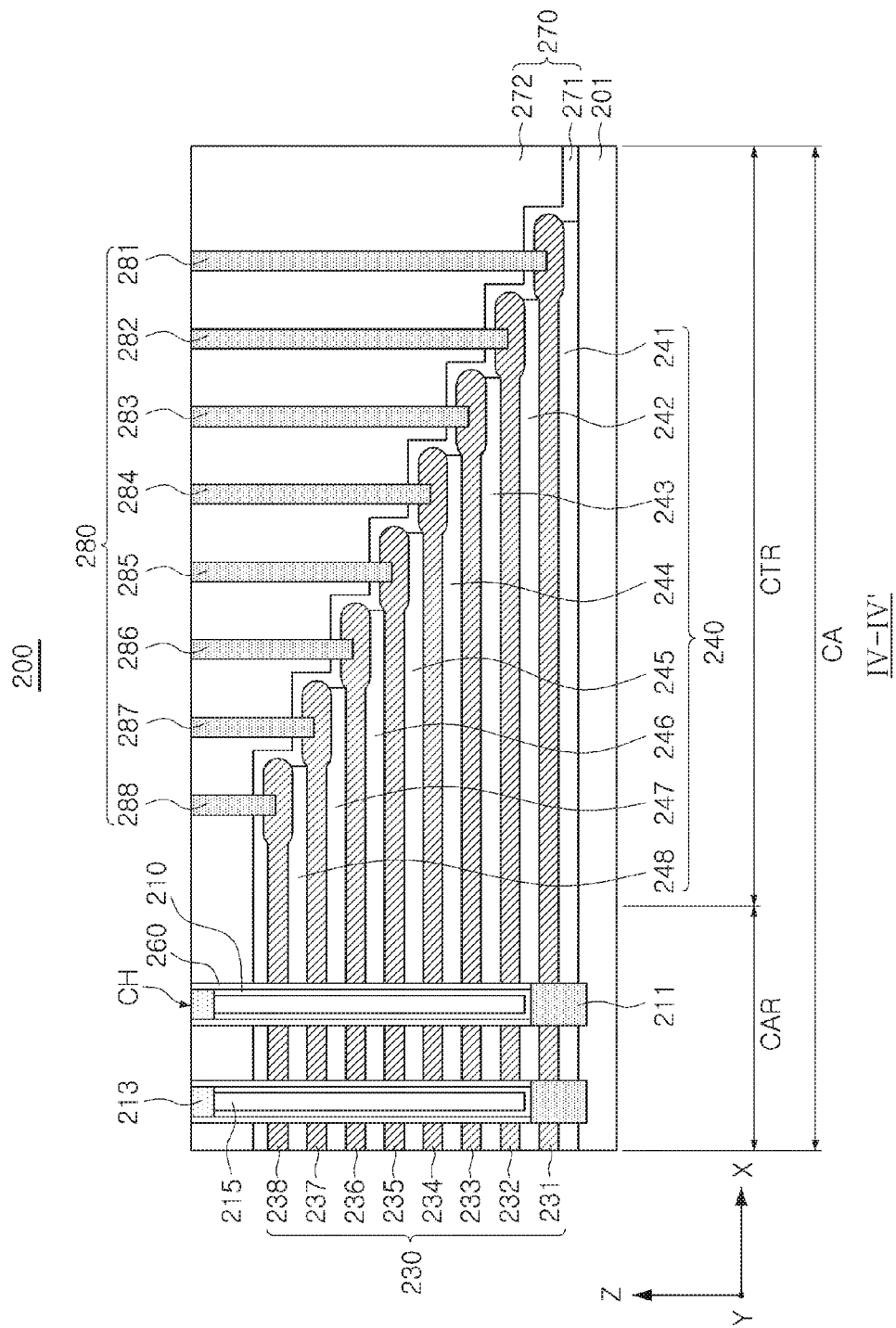

Referring to FIGS. 38 and 39, a plurality of gate electrode layers 231 to 238 (gate electrode layers 230), a plurality of contacts 281 to 288 (contacts 280), and a common source line 250 may be formed. The common source line 250 may be formed inside an isolation insulating layer 251 provided in the word line cut WC, and may be connected to a source region provided in the substrate 201 there below.

The gate electrode layers 230 may be formed by filling the opening regions OP formed by removing the sacrificial layers 220, with polysilicon, a metal, a metal silicide, or the like. Since the opening regions OP formed by removing the sacrificial layers 220 has a relatively increased height in the pad regions, the gate electrode layers 230 may also have a relatively great thickness in the pad regions.

The gate electrode layers 230 may be connected to the contacts 280 in the pad regions. Since the gate electrode layers 230 has a relatively great thickness in the respective pad regions, a problem in which a portion of the contacts 280 penetrate through the gate electrode layers 230 in a process of forming the contacts 280 to cause the occurrence of a short defect, may be solved. Accordingly, the number of stacked gate electrode layers 230 may be increased while improving the reliability thereof, and thus, the memory device 200 having improved integration may be provided.

Figure 40:
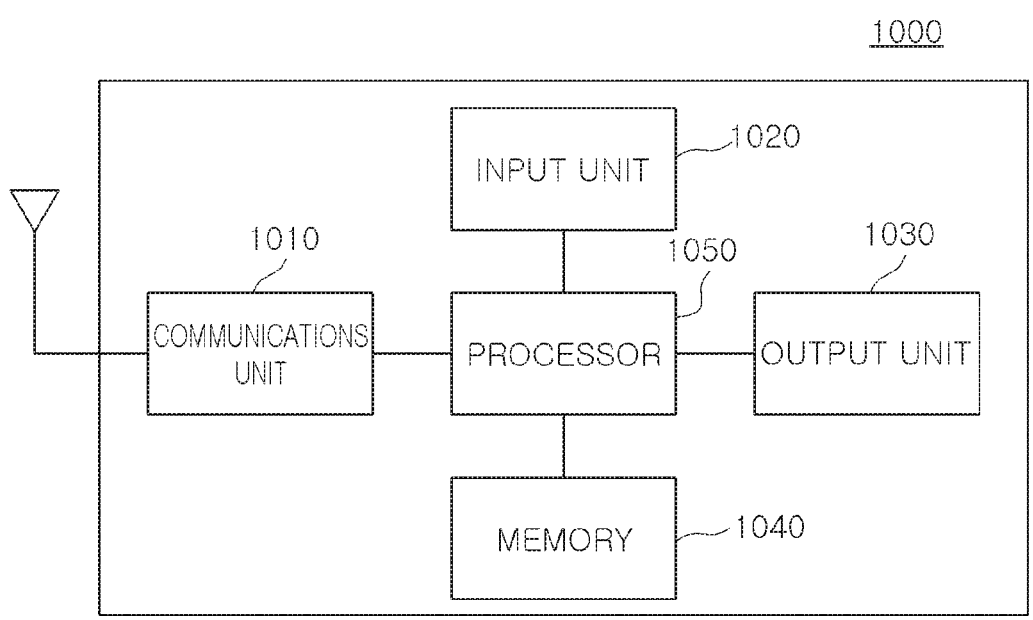
FIG. 40 is a block diagram of an electronic device according to an example embodiment of the inventive concepts.

FIG. 40 is a block diagram of an electronic device according to an example embodiment of the inventive concepts.

With reference to FIG. 40, an electronic device 1000 according to example embodiments may include a communications unit 1010, an input unit 1020, an output unit 2030, a memory 2040, and a processor 2050.

The communications unit 1010 may include a wired/wireless communications module and may include a wireless Internet module, a near-field communications module, a global positioning system (GPS) module, a mobile communications module, and the like. The wired/wireless communications module included in the communications unit 1010 may be connected to an external communications network via various communications protocols to transmit or receive data.

The input unit 1020 may be a module provided to control operations of the electronic device 1000 by a user, and may include a mechanical switch, a touchscreen, a sound recognition module, and the like. In addition, the input unit 1020 may also include a mouse operating in a trackball or laser pointer scheme, or the like, or a finger mouse device, and may further include various sensor modules through which data may be input by a user.

The output unit 1030 may output information processed by the electronic device 1000 in audio or visual form, and the memory 1040 may store a program for processing or controlling by the processor 1050, data, or the like. The memory 1040 may include one or more of the memory devices 100, 200, 300, and 400 according to example embodiments, and the processor 1050 may transfer a command to the memory 1040 according to a required operation to thus write data thereto or read data therefrom.

The memory 1040 may be embedded in the electronic device 2000, or may communicate with the processor 1050 via a separate interface. In the case of communicating with the processor 1050 via the separate interface, the processor 1050 may write data to the memory 1040 or read data therefrom via various interface standards such as SD, SDHC, SDXC, MICRO SD, USB, and the like.

The processor 1050 may control operations of respective parts included in the electronic device 1000. The processor 1050 may perform controlling and processing relevant to voice communications, video communications, data communications, and the like, or may also perform controlling and processing for multimedia playback and management. In addition, the processor 1050 may process an input transferred through the input unit 1020 by a user, and may output the result thereof via the output unit 1030. In addition, the processor 2050 may write data required to control operations of the electronic device 1000 to the memory 1040 or read data therefrom.

As set forth above, with a memory device according to example embodiments, gate electrode layers may have a relatively increased thickness in a pad region in which they are connected to contacts. Thus, when the integration of a memory device is increased, the number of gate electrode layers is increased, and a thickness of one gate electrode layer is reduced, a short defect in which contacts penetrate through gate electrode layers may be prevented. Whereby, a memory device may have improved reliability and integration.

While example embodiments have been shown and described above, it will be apparent to those skilled in the art that modifications and variations could be made without departing from the scope of the present inventive concept as defined by the appended claims.

We claim:

1. A semiconductor device, comprising:
    a stack of alternating first interlayer insulating layers and gate electrode layers on a substrate, at least one of the gate electrode layers having a first portion and a second portion, the second portion forming an end portion of the at least one gate electrode layer, and a bottom surface of the second portion being at a lower level than a bottom surface of the first portion; and a contact plug extending from the second portion, wherein an end of the second portion has a concave profile.

2. The semiconductor device of claim 1, wherein the at least one gate electrode layer curves convexly from the bottom surface of the first portion to the bottom surface of the second portion.

3. The semiconductor device of claim 2, wherein the second portion curves convexly from a bottom surface to an end of the second portion.

4. The semiconductor device of claim 1, wherein the second portion curves convexly from a bottom surface to an end of the second portion.

5. The semiconductor device of claim 1, wherein an end of the second portion has a half bullnose shape.

6. The semiconductor device of claim 1, wherein a top surface of the second portion is at a higher level than a top surface of the first portion.

7. The semiconductor device of claim 6, wherein a first difference between a level of the bottom surface of the second portion and a level of the bottom surface of the first portion is greater than a second difference between a level of the top surface of the second portion and a level of the top surface of the first portion.

8. The semiconductor device of claim 6, wherein an end of the second portion has a full bullnose shape.

9. The semiconductor device of claim 6, wherein the at least one gate electrode layer curves convexly from the bottom surface of the first portion to the bottom surface of the second portion, and the at least one gate electrode layer curves convexly from the top surface of the first portion to the top surface of the second portion.

10. The semiconductor device of claim 6, further comprising:

a second interlayer insulating layer over the stack; and wherein the contact plug extends through the second interlayer insulating layer.

11. The semiconductor device of claim 10, wherein a portion of the second interlayer insulating layer at the second portion include impurities, and a portion of the first interlayer insulating layers directly above and directly below the second portion include the impurities.

12. The semiconductor device of claim 1, further comprising:

a second interlayer insulating layer over the stack; and wherein the contact plug extends through the second interlayer insulating layer.

13. The semiconductor device of claim 12, wherein a portion of the second interlayer insulating layer at the second portion include impurities, and a portion of the first interlayer insulating layer directly below the second portion includes the impurities.

14. A semiconductor device, comprising:

a stack of alternating interlayer insulating layers and gate electrode layers on a substrate, at least one of the gate electrode layers having a first portion and second portion, the second portion forming an end portion of the at least one gate electrode layer, and a bottom surface of the second portion being closer to the substrate than a bottom surface of the first portion; and a contact plug extending from the second portion, wherein an end of the second portion has a concave profile.

15. A semiconductor device, comprising:

a stack of alternating interlayer insulating layers and gate electrode layers on a substrate, at least one of the gate electrode layers having a first portion and second portion, the second portion forming an end of the at least one gate electrode layer, and as the at least one gate electrode layer transitions from the first portion to the second portion, the at least one gate electrode layer projects towards the substrate; and a contact plug extending from the second portion, wherein an end of the second portion has a concave profile.

16. The semiconductor device of claim 15, wherein a thickness of the second portion is greater than a thickness of the first portion.

17. The semiconductor device of claim 15, wherein a bottom surface of the second portion is closer to the substrate than a bottom surface of the first portion.

18. The semiconductor device of claim 15, wherein an upper surface of the second portion is farther from the substrate than an upper surface of the first portion.

* * * * *